(12) United States Patent
Iwai

(10) Patent No.: US 8,945,411 B2
(45) Date of Patent: Feb. 3, 2015

(54) PLASMA PROCESSING APPARATUS AND PLASMA PROCESSING METHOD

(75) Inventor: Tetsuhiro Iwai, Osaka (JP)

(73) Assignee: Panasonic Corporation, Osaka (JP)

( * ) Notice: Subject to any disclaimer, the term of this patent is extended or adjusted under 35 U.S.C. 154(b) by 14 days.

(21) Appl. No.: 13/823,945

(22) PCT Filed: Mar. 26, 2012

(86) PCT No.: PCT/JP2012/002078
§ 371 (c)(1),
(2), (4) Date: Mar. 15, 2013

(87) PCT Pub. No.: WO2012/140837
PCT Pub. Date: Oct. 18, 2012

(65) Prior Publication Data
US 2013/0180953 A1    Jul. 18, 2013

(30) Foreign Application Priority Data

Apr. 13, 2011   (JP) ................................ 2011-089262

(51) Int. Cl.
*G01L 21/30* (2006.01)
*G01R 31/00* (2006.01)
*B05C 13/00* (2006.01)
*H01L 21/673* (2006.01)
*H01L 21/677* (2006.01)
(Continued)

(52) U.S. Cl.
CPC ............ *B05C 13/00* (2013.01); *H01L 21/6732* (2013.01); *H01L 21/67742* (2013.01); *H01L 21/67754* (2013.01); *H01L 21/681* (2013.01); *H01L 21/68764* (2013.01); *H01L 21/68771* (2013.01); *B44C 1/227* (2013.01); *C23C 16/50* (2013.01)

USPC .................................. 216/60; 216/59; 216/67

(58) Field of Classification Search
USPC .................................. 216/60, 59, 67; 438/716
See application file for complete search history.

(56) References Cited

U.S. PATENT DOCUMENTS

| 5,509,771 A | 4/1996 | Hiroki |
| 5,558,482 A | 9/1996 | Hiroki et al. |

(Continued)

FOREIGN PATENT DOCUMENTS

| JP | 6-51260 | 2/1994 |
| JP | 6-140492 | 5/1994 |

(Continued)

OTHER PUBLICATIONS

International Search Report (ISR) issued Jun. 9, 2012 in International (PCT) Application No. PCT/JP2012/002078.

(Continued)

*Primary Examiner* — Roberts Culbert
(74) *Attorney, Agent, or Firm* — Wenderoth, Lind & Ponack, L.L.P.

(57) ABSTRACT

The present invention is to achieve a reduction both in size of a plasma processing apparatus and an installation area thereof. A dry etching apparatus includes a stock unit that includes a cassette storing a tray that can be conveyed and that stores substrates. In a conveying unit storing a conveying apparatus of the tray, a rotary stage is provided. Rotational angular position adjustment of the tray is performed by rotating the rotary stage placed on the tray before being subjected to dry etching and detecting a notch by a notch detecting sensor.

7 Claims, 18 Drawing Sheets

(51) Int. Cl.
*H01L 21/68* (2006.01)
*H01L 21/687* (2006.01)
*B44C 1/22* (2006.01)
*C23C 16/50* (2006.01)

(56) References Cited

U.S. PATENT DOCUMENTS

| | | | |
|---|---|---|---|
| 5,636,960 A | | 6/1997 | Hiroki et al. |
| 6,120,601 A | * | 9/2000 | Landau et al. .................. 117/98 |
| 2009/0194237 A1 | | 8/2009 | Nozawa et al. |
| 2009/0255901 A1 | | 10/2009 | Okita et al. |
| 2010/0051584 A1 | | 3/2010 | Okita et al. |
| 2012/0256363 A1 | | 10/2012 | Okita et al. |

FOREIGN PATENT DOCUMENTS

| | | |
|---|---|---|
| JP | 8-246151 | 9/1996 |
| JP | 10-242250 | 9/1998 |
| JP | 2001-44257 | 2/2001 |
| JP | 2002-43292 | 2/2002 |
| JP | 2002-43394 | 2/2002 |
| JP | 2004-241428 | 8/2004 |
| JP | 2006-19544 | 1/2006 |
| JP | 2007-109771 | 4/2007 |
| JP | 2009-182177 | 8/2009 |

OTHER PUBLICATIONS

International Preliminary Report issued Oct. 24, 2013 in corresponding International Application No. PCT/JP2012/002078, with English translation.

* cited by examiner

PLASMA PROCESSING APPARATUS AND PLASMA PROCESSING METHOD

TECHNICAL FIELD

The present invention relates to a plasma processing apparatus such as a dry etching apparatus and a CVD apparatus, and a plasma processing method.

BACKGROUND ART

As a plasma processing apparatus such as a dry etching apparatus and a CVD apparatus, what is known is an apparatus that includes: a plasma processing unit in which plasma processing to substrates is performed; a substrate stock unit; a conveying unit that stores a conveying apparatus for conveying substrates between the plasma processing unit and the stock unit. In addition to these unit, the apparatus further includes, as a chamber separate from the aforementioned units, an alignment unit in which alignment of the substrates is performed before the substrates are fed into the plasma processing unit (see Patent Documents 1 to 4).

PRIOR ART DOCUMENT

Patent Documents

Patent Document 1: Japanese Unexamined Patent Application Publication No. 2009-182177
Patent Document 2: Japanese Unexamined Patent Application Publication No. 2002-43292
Patent Document 3: Japanese Unexamined Patent Application Publication No. 6-51260
Patent Document 4: Japanese Unexamined Patent Application Publication No. 2001-44257

SUMMARY OF THE INVENTION

Problem to be Solved by the Invention

When the alignment unit is provided separately from the plasma supplying unit, the stock unit, and the conveying unit, the plasma processing apparatus is constituted by at least four chambers. Therefore, an increase in both the size of the apparatus and the installation area is inevitable.

An object of the present invention is to achieve a reduction both in size of a plasma processing apparatus and an installation area thereof.

Means for Solving the Problem

In order to achieve the object stated above, the present invention is constituted as follows.

The first aspect of the present invention provide a plasma processing apparatus, includes: a stock unit that stores a target object of plasma processing; a plasma processing unit that performs the plasma processing to the target object conveyed from the stock unit; a conveying unit that stores a conveying apparatus conveying the target object; a preparatory stage that is stored in the conveying unit, the target object before being conveyed from the stock unit to the plasma processing unit being arranged on the preparatory stage; and a preliminary processing unit that performs preliminary processing for the plasma processing to the target object in cooperation with the preparatory stage.

The target object may be a tray that can be conveyed and that accommodates a substrate, or it may be a large substrate itself. The tray may accommodate the substrate in a substrate accommodating hole penetrating through in the thickness direction, or it may accommodate the substrate in a bottomed substrate accommodating hole.

By the preparatory stage and the preliminary processing unit provided in the conveying unit, the preliminary processing for the plasma processing is performed. Therefore, it is not necessary to separately provide a chamber dedicated to the preliminary processing. As a result, a reduction both in the size of the plasma processing apparatus and the installation area can be achieved.

Specifically, the preparatory stage is arranged on the stock unit side of the conveying unit. Particularly, in the case that the conveying apparatus includes a holding unit that holds the target object and a pivotal shaft that rotates the holding unit in a horizontal plane, the preparatory stage may be arranged between the pivotal shaft and the stock unit. More preferably, an inside of the conveying unit and an inside of the stock unit communicate with each other through a communication opening, and the preparatory stage is arranged on a virtual line connecting between the pivotal shaft and a center of the stock unit, the preparatory stage being arranged between the pivotal shaft and the communication opening.

With this structure, the target object arranged on the preparatory stage for the preliminary processing by the preliminary processing unit may not necessarily be stored in the conveying unit in its entirety, and the target object placed on the preparatory stage may partially enter the communication opening. As a result, in the range in which the conveying apparatus can operate, that is, in which the condition that the holding unit holding the target object can rotate by the pivotal shaft is satisfied, the size of the space in the conveying unit can be set to a minimum, and a reduction in both the size of the plasma processing apparatus and the installation area can further effectively be achieved.

The preliminary processing performed by the preparatory stage and the preliminary processing unit is, for example, alignment processing in the circumferential direction.

The preparatory stage can rotate about a rotary shaft extending in a vertical direction, and the preliminary processing unit adjusts a rotational angular position of the target object placed on the preparatory stage by rotating the preparatory stage about the rotary shaft.

Specifically, the target object includes a notch at its outer circumference, and the preliminary processing unit includes a notch detecting sensor that optically detects the notch of the target object placed on the preparatory stage, the preliminary processing unit adjusting the rotational angular position of the target object by rotating the preparatory stage according to an output from the notch detecting sensor.

The preliminary processing unit performs an inspection as to whether or not the target object is in a state suitable for the plasma processing.

For example, the target object is a tray that can be conveyed and that accommodates a substrate, and the preliminary processing unit includes a substrate detecting sensor that optically detects presence and absence of the substrate on the tray placed on the preparatory stage, to determine whether the substrate is present or absent based on art output from the substrate detecting sensor.

Further, the target object is a tray that can be conveyed and that accommodates a substrate, and the preliminary processing unit includes a misalignment detecting sensor that optically detects misalignment of the substrate relative to the tray placed on the preparatory stage, to determine whether or not the substrate is misaligned relative to the tray based on an output from the substrate detecting sensor.

Preferably, the preparatory stage rises and lowers along the vertical direction.

With this structure, it is not necessary for the conveying apparatus to rise or lower for placing the target object on the preparatory stage. Thus, the structure of the apparatus can be simplified.

The second aspect of the present invention provides a plasma processing method, including: conveying a target object of plasma processing stored in a stock unit by a conveying apparatus stored in a conveying unit to a preparatory stage stored in the conveying unit; performing preliminary processing for the plasma processing to the target object placed on the preparatory stage; conveying the target object having undergone the preliminary processing by the conveying apparatus to the plasma processing unit and performing the plasma processing; and conveying the target object having undergone the plasma processing from the plasma processing unit to the stock unit.

Particularly, it is preferable that the preparatory stage is arranged on a virtual line connecting between the pivotal shaft and a center of the stock unit, the preparatory stage being arranged between the pivotal shaft and the communication opening, and when the preliminary processing is performed, the target object arranged on the preparatory stage partially enters the communication opening.

EFFECT OF THE INVENTION

With the plasma processing apparatus and the plasma processing method of the present invention, the preliminary processing (e.g., the alignment processing in the circumferential direction) for plasma processing is performed at the preparatory stage provided in the conveying unit. Therefore, it is not necessary to separately provide a chamber dedicated to the preliminary processing. As a result, a reduction in both the size of the plasma processing apparatus and the installation area can be achieved.

MODES FOR CARRYING OUT THE INVENTION

In the following, with reference to the drawings, a description will be given of an embodiment of the present invention. It is to be noted that, the present invention is not to be limited by the embodiment.

(Embodiment)

FIGS. 1 to 4 show an ICP (inductively coupled plasma) dry etching apparatus 1 according to an embodiment of the present invention. With the dry etching apparatus 1, a tray 3 for conveying substrates 2 is used.

Figure 11:
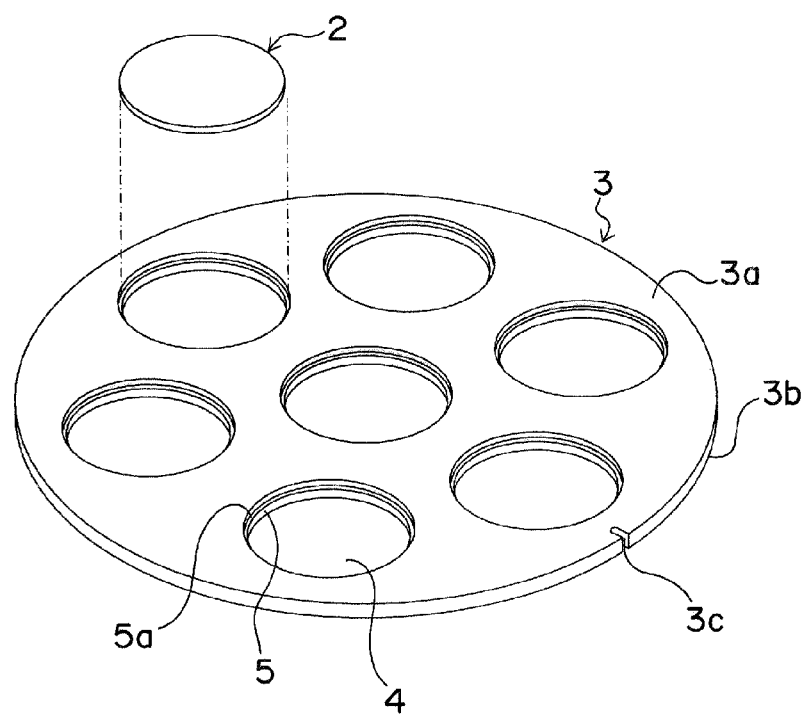
FIG. 11 is a perspective view of the tray and the substrate.

With reference to FIG. 11, the tray 3 is provided with a plurality of (seven in the present embodiment) substrate accommodating holes 4 penetrating through from a top face 3a to a bottom face 3b in the thickness direction. One substrate accommodating hole 4 is positioned at the center of the tray 3, and the other six substrate accommodating holes 4 are arranged at equiangular intervals in a plain view about the one substrate accommodating hole 4. Each substrate accommodating hole 4 stores one substrate 2. At the hole wall of each substrate accommodating hole 4, a substrate holding portion 5 projecting toward the center of the substrate accommodating hole 4 is provided. A substrate holding face 5a being the top face of the substrate holding portion 5 holds around the circumference of the bottom face of the substrate 2 accommodated in the substrate accommodating hole 4. In the present embodiment, the substrate holding portion 5 is provided at the entire circumference of the hole wall of the substrate accommodating hole 4, and is annular whose width is constant in a plain view. As described above, since the substrate accommodating hole 4 is formed to penetrate through the tray 3 in the thickness direction, as seen from the bottom face 3b of the tray 3, the bottom face of the substrate 2 is exposed in the substrate accommodating hole 4 (i.e., the circular area surrounded by the tip of the substrate holding portion 5). Each substrate holding portion 5 may be a plurality of projections provided at intervals in the circumferential direction of the hole wall of the substrate accommodating hole 4. At the outer circumference of the tray 3, a notch 3c for detecting the rotational angular position is provided.

With reference to FIGS. 1 to 4, the dry etching apparatus 1 includes a plasma processing unit 11 that performs dry etching to the substrates 2, and a conveying unit 12 that is provided so as to be adjacent to the plasma processing unit 11 and that stores a single-arm type conveying apparatus 15. Further, a stock unit 13 for feeding and collecting the tray 3 is provided adjacent to the conveying unit 12.

Figure 1:
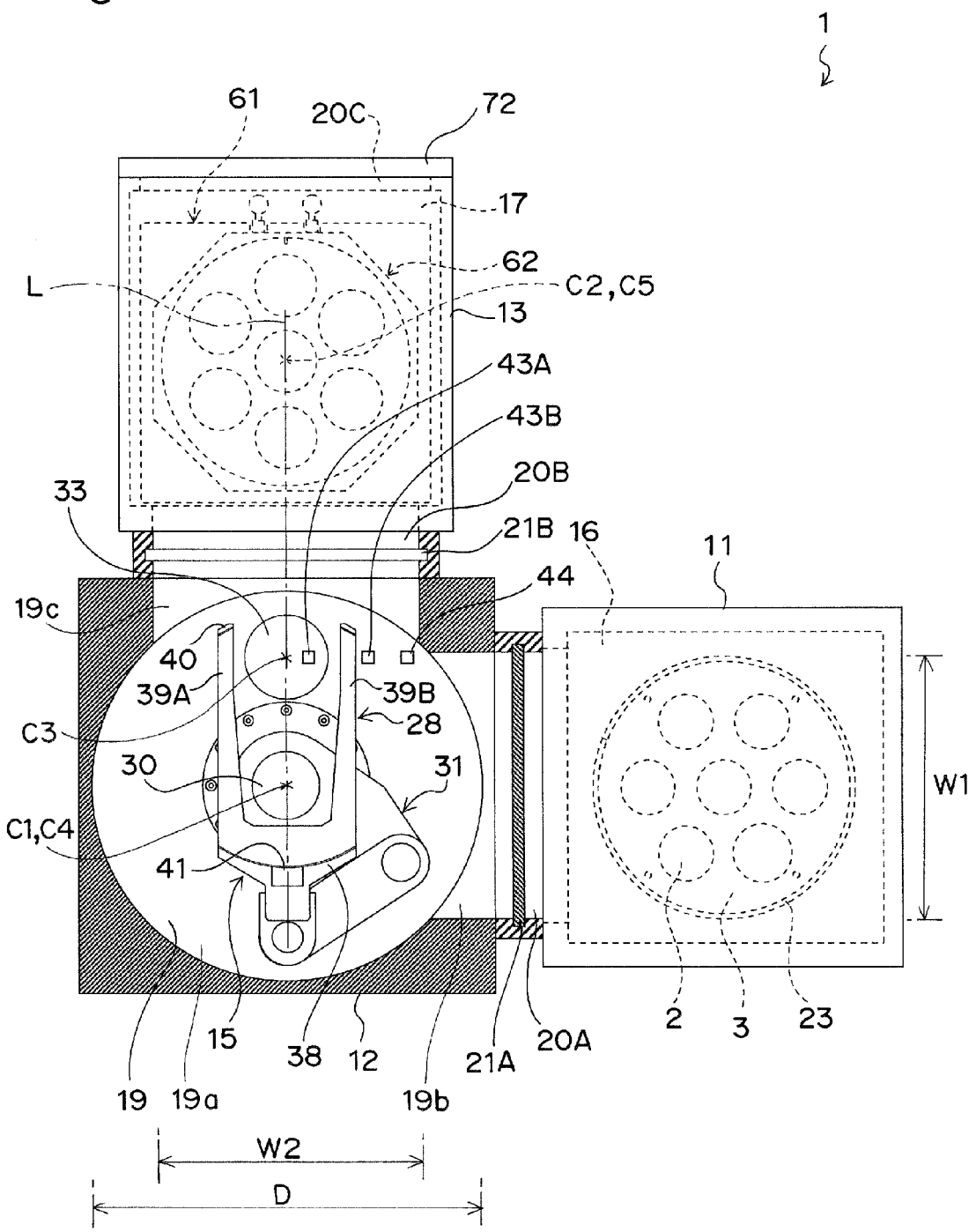
FIG. 1 is a horizontal cross-sectional view of a dry etching apparatus according to an embodiment of the present invention.

With reference to FIG. 1, in connection with the dry etching apparatus 1 of the present embodiment, the plasma processing unit 11, the conveying unit 12, and the stock unit 13 are arranged to substantially form an L-shape in a plain view. That is, the plasma processing unit 11 is arranged on the right side with reference to the conveying unit 12 in FIG. 1, and the stock unit 13 is arranged on the top side with reference to the conveying unit 12 in the drawing. A communication opening 20A is provided between a processing chamber 16 in the plasma processing unit 11 and a conveying chamber 19 in the conveying unit 12. A communication opening 20B is provided between the conveying chamber 19 in the conveying unit 12 and a storage chamber 17 in the stock unit 13. Gate valves 21A and 21B are respectively attached to the communication openings 20A and 20B. In FIG. 1, the gate valve 21A of the communication opening 20A is closed, and the gate valve 21B of the communication opening 20B is open.

Figure 2:
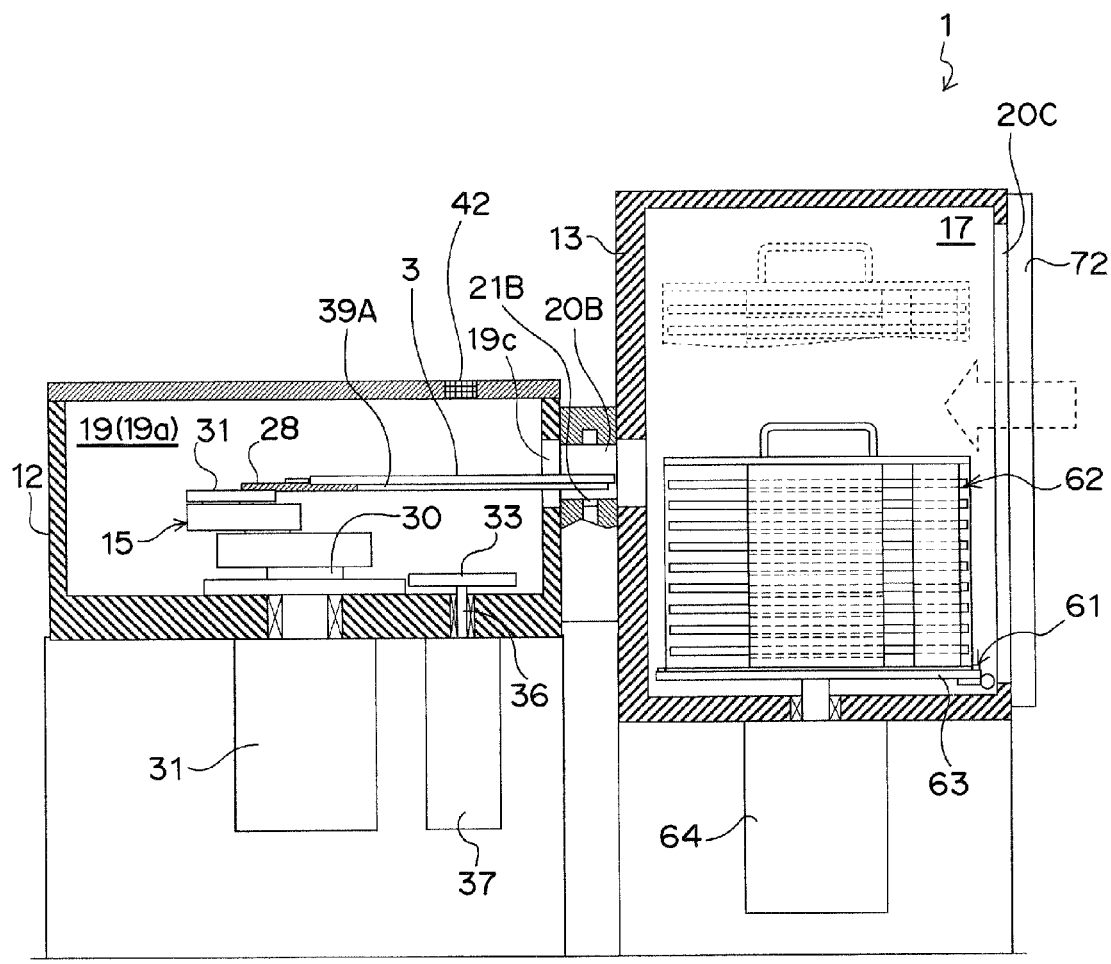
FIG. 2 is a cross-sectional view of the dry etching apparatus according to the embodiment of the present invention (line II-II shown in FIG. 13A)

With reference to FIGS. 1, 2, 4 to 9, a description will be given of the stock unit 13. The stock unit 13 includes a lifter 61, and a cassette 62 removably mounted on the lifter 61. The cassette 62 stores the trays 3. As shown in FIG. 2, the lifter 61 includes an up-and-down table 63 arranged in the storage chamber 17 of the stock unit 13 and a lifter driving mechanism 64 that raises and lowers the up-and-down table 63.

In the following, a description will be given of the cassette 62.

As shown in FIGS. 7A to 9, the cassette 62 can store a plurality of trays 3 (up to nine pieces in the present embodiment) between a bottom plate 65 and a top plate 66 at intervals in the horizontal attitude. Further, each tray 3 stored in the cassette 62 does not have its entire bottom face 3a held. Instead, only a plurality of places (four places in the present embodiment) around the outer circumference of the bottom face 3a is held.

Figure 8:
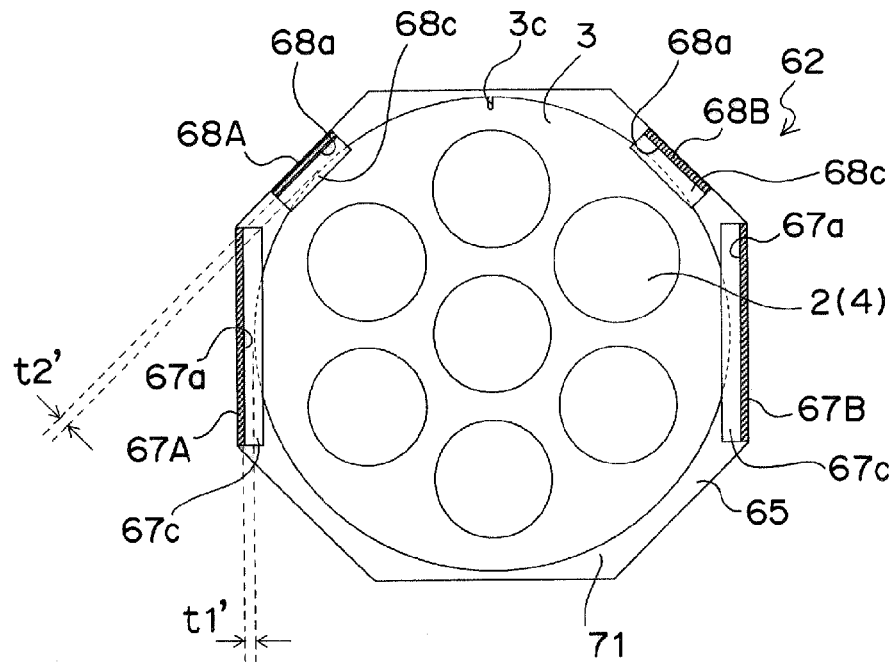
FIG. 8 is a cross-sectional view taken along line VIII-VIII shown in FIG. 7B.
Figure 9:
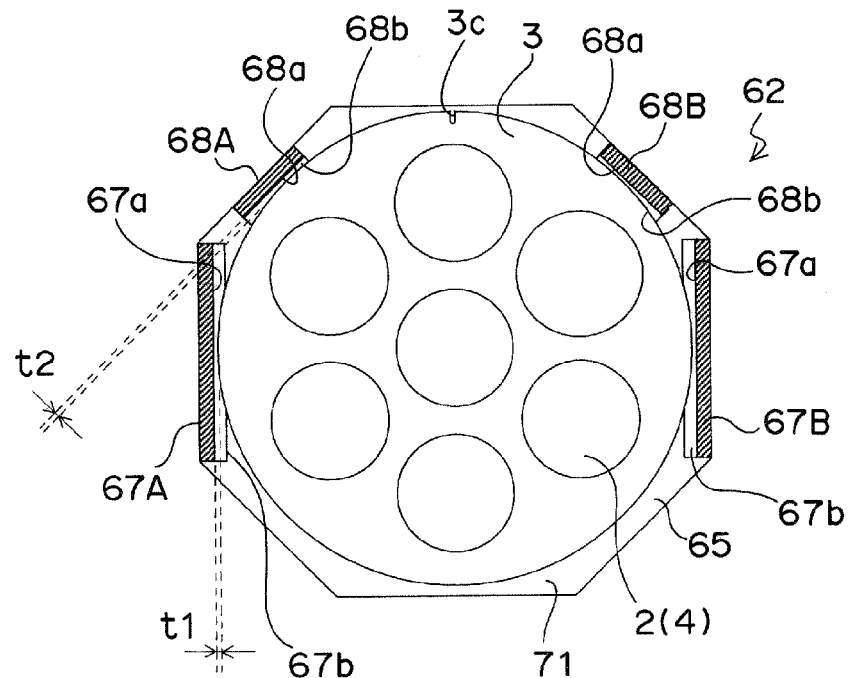
FIG. 9 is a cross-sectional view taken along line IX-IX shown in FIG. 7B.

As shown most clearly in FIGS. 8 and 9, the cassette 62 includes main shelf plate members 67A and 67B extending in the vertical direction so as to oppose to each other with reference to the center of the tray 3 in a plain view, and sub-shelf plate members 68A and 68B extending in the vertical direction at the positions adjacent to the main shelf plate members 67A and 67B, respectively. The main shelf plate members 67A and 67B and the sub-shelf plate members 68A and 68B have their respective bottom ends coupled to the bottom plate 65, and have their respective top ends coupled to the top plate 66. The opposite side of the sub-shelf plate members 68A and 68B relative to the main shelf plate members 67A and 67B constitutes an inlet/outlet opening 71 for the cassette 62. In other words, the sub-shelf plate members 68A and 68B are arranged on the depth side relative to the inlet/outlet opening 71.

From inner faces 67a of respective main shelf plate members 67A and 67B, a plural stage (eight stages in the present embodiment) of main shelf portions 67b project at intervals, each of which main shelf portions 67b is relatively long rectangular in a plain view and has a flat top face. Further, from inner faces 68a of respective sub-shelf plate members 68A and 68B also, a plural stage (eight stages in the present embodiment) of main shelf portions 68b project, each of which main shelf portions 68b is relatively short rectangular in a plain view and has a flat top face. The height of the main shelf portions 67b and 68b (i.e., the position of each top face in the height direction) of their respective main shelf plate members 67A and 67B and the sub-shelf plate members 68A and 68B is uniform at each stage. For example, the main shelf portions 67b and 68b of the bottommost end of the main shelf plate members 67A and 67B and the sub-shelf plate members 68A and 68B are identical in height. Accordingly, as shown most clearly in FIG. 9, as the bottom face 3a is held by the main shelf portions 67b and 68b of their respective main shelf plate members 67A and 67B and the sub-shelf plate members 68A and 68B constituting the identical stage, the tray 3 is held in the horizontal attitude. Specifically, in the position around the outer circumference of the tray 3, the bottom face 3a is held by opposing main shelf portions 67b at two regions opposing to each other with reference to the center of the tray 3, and the bottom face 3a is held by the main shelf portions 68b on the depth side in other two regions in close proximity to the aforementioned regions.

As will be detailed later, the trays 3 are held by the main shelf portions 67b and 68b of respective stages, each tray 3 accommodating the substrates 2 before or after being subjected to dry etching performed by the plasma processing unit 11.

The interval between the inner faces 67a of the main shelf plate members 67A and 67B of their respective main shelf portions 67b and 68b is set to a minimum in the range allowing the tray 3 to advance or recede through the inlet/outlet opening 71. That is, a clearance t1 between the tray 3 accurately placed on the main shelf portions 67b and 68b and the inner face 67a of the main shelf plate members 67A and 67B is set to a minimum. Accordingly, the inner faces 67a of the main shelf plate members 67A and 67B have the function of positioning the tray 3 in the horizontal directional position in FIG. 9 relative to the cassette 62. Further, a clearance t2 between the tray 3 accurately placed on the main shelf portions 67b and 68b and the inner faces 68a of the sub-shelf plate members 68A and 68B is set to a minimum. Accordingly, the inner faces 68a of the sub-shelf plate members 68A and 68B have the function of positioning the tray 3 in the top-bottom directional position (i.e., the position in the direction from the inlet/outlet opening 71 toward the depth side of the cassette 62) in FIG. 9 relative to the cassette 62.

At the inner faces 67a of the main shelf plate members 67A and 67B, temporary placement shelf portions 67c project at a higher position and at an interval relative to the topmost stage-main shelf portion 67b. Further, at the inner face 68a of the sub-shelf plate members 68A and 68B, temporary placement shelf portions 68c project at a higher position and at an interval relative to the topmost stage-main shelf portion 68b. Similarly to the main shelf portions 67b and 68b, the temporary placement shelf portions 67c and 68c are each rectangular in a plain view and each have a flat top face.

The interval between the inner faces 67a of the main shelf plate members 67A and 67B of the temporary placement shelf portions 67c and 68c and the interval between the inner faces 68a of the sub-shelf plate members 68A and 68B is set to be wider than the interval of the main shelf portions 67b and 68b. That is, a clearance t1' between the tray 3 placed on the temporary placement shelf portions 67c and 68c and the inner faces 67a of the main shelf plate members 67A and 67B is set to be fully greater than the clearance t1 (FIG. 9). Accordingly, even when the horizontal directional position of the tray 3 in FIG. 8 is displaced to some extent, the tray 3 is not brought into contact with the inner faces 67a. Similarly, a clearance t2' between the tray 3 placed on the temporary placement shelf portions 67c and 68c and the inner faces 68a of the sub-shelf plate members 68A and 68B is set to be fully greater than the clearance t2 (FIG. 9). Accordingly, even when the vertical directional position of the tray 3 in FIG. 8 is displaced to some extent, the tray 3 is not brought into contact with the inner faces 68a.

As will be described later, on the temporary placement shelf portions 67c and 68c, the tray 3 after being subjected to the alignment processing and before being subjected to dry etching is temporarily placed.

Figure 5:
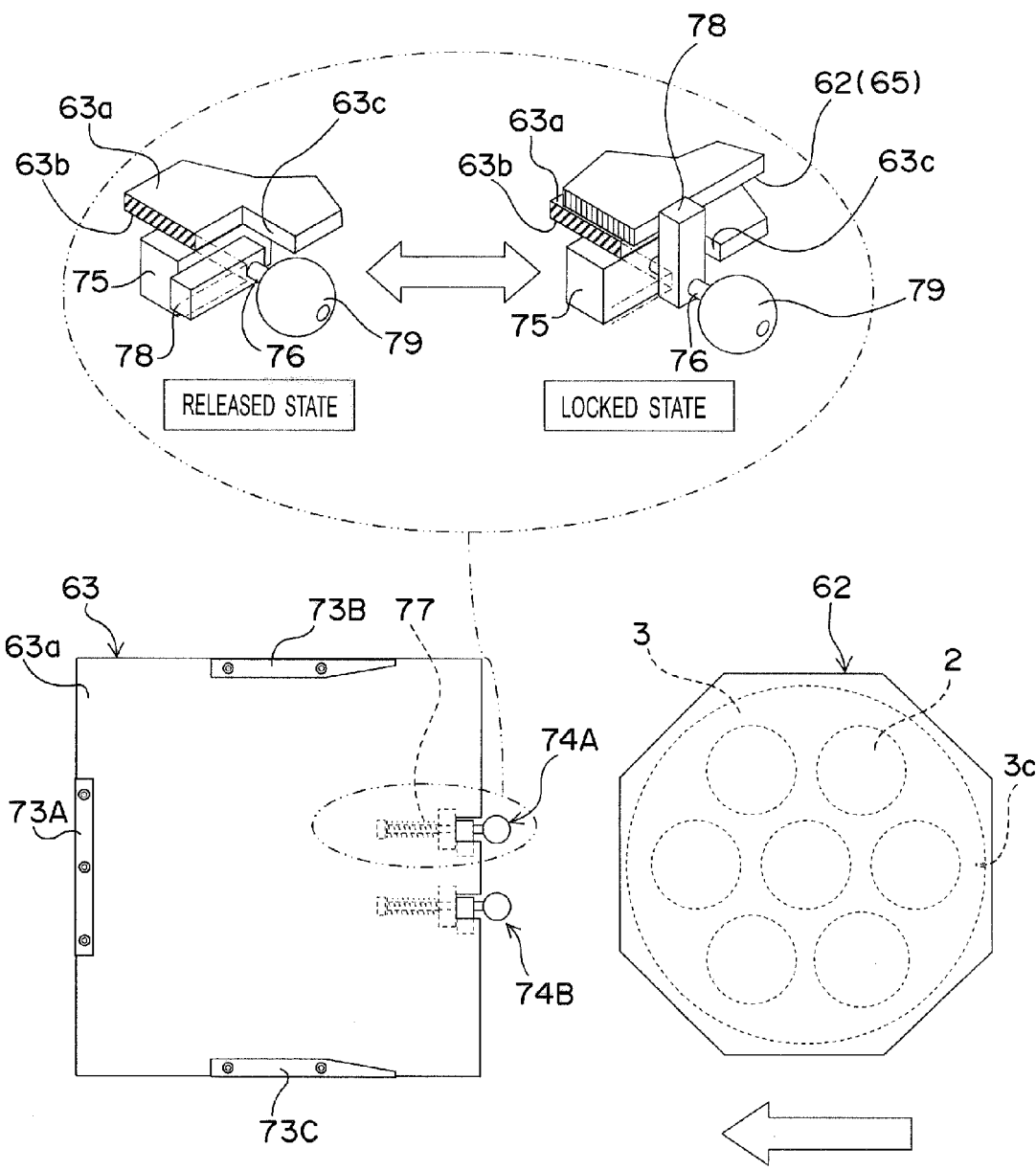
FIG. 5 is a plan view of a lifter and a cassette.
Figure 6:
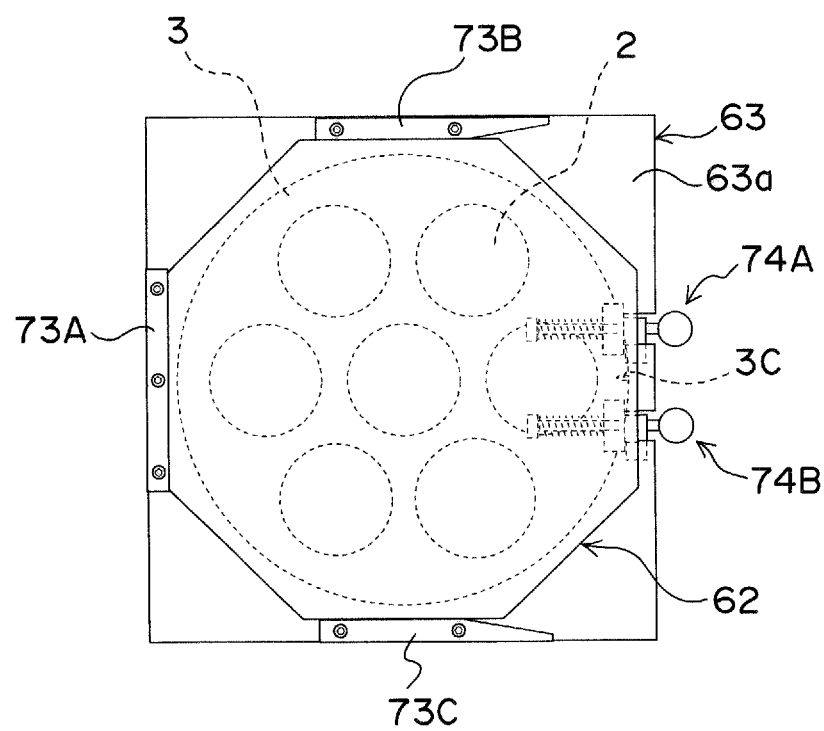
FIG. 6 is a plan view of the lifter on which the cassette is mounted.
Figure 7A:
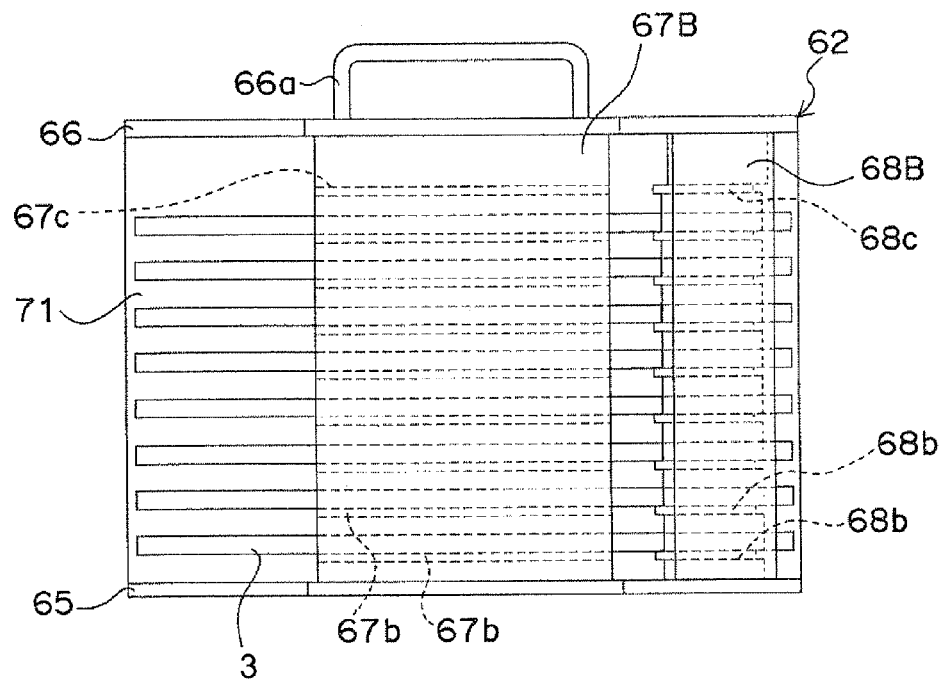
FIG. 7A is a side view of the cassette.
Figure 7B:
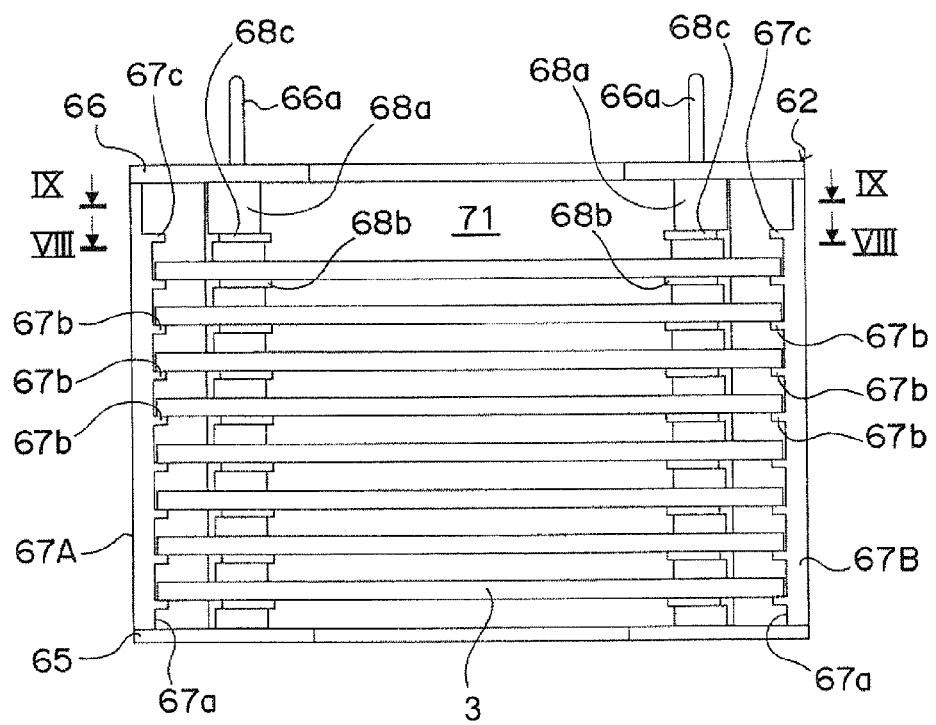
FIG. 7B is a front view of the cassette.

Next, a description will be given of the lifter 61. With reference to FIGS. 5 and 6, the bottom plate 65 of the cassette 62 is placed on the top face 63a of the up-and-down table 63 of the lifter 61. Specifically, as indicated by the arrows in FIGS. 2 and 5, the cassette 62 having stored therein the trays 3 is conveyed into the storage chamber 17 from the communication opening 20C between the outside and the storage chamber 17 of the stock unit 13 whose door 72 is open, and the bottom plate 65 is arranged on the top face 63a of the up-and-down table 63.

At the top face 63a of the up-and-down table 63, fixed restriction portions 73A, 73B, and 73C for positioning the horizontal directional position of the cassette 62 so as to abut on the end face of the bottom plate 65 are provided. One restriction portion 73A is arranged on the depth side in the carry-in direction (the arrow in FIG. 5) of the cassette 62, and two restriction portions 73B and 73C are arranged on the opposing sides with reference to the carry-in direction. Further, the up-and-down table 63 of the lifter 61 includes lock mechanisms 74A and 74B that releasably engage with the bottom plate 65 on the near side in the carry-in direction.

With reference to FIG. 5, the lock mechanisms 74A and 74B each include a rod 76 that is held by a bearing portion 75 fixed to the bottom face 63b of the up-and-down table 63, so that the rod 76 is capable of advancing and receding in the carry-in direction of the cassette 62 (the arrow in FIG. 5) and rotating. The rod 76 is elastically biased by a spring 77 toward the depth side in the carry-in direction. Further, a proximal end side of a movable restriction member 78 is fixed to the rod 76. Further, an operational knob 79 is provided at the end portion of the rod 76 projecting from the up-and-down table 63.

By the knob 79 being operated so as to draw out and rotate the rod 76 against the biasing force of the spring 77, the lock mechanisms 74A and 74B can be set to either one of the "released state" and the "locked state" shown in FIG. 5. In the "released state", the movable restriction member 78 is stored on the bottom face 63 side of the up-and-down table 63, and does not project to the top face 63a. When the lock mechanisms 74A and 74B are in the "released state", the cassette 62 is conveyed to the lifter 61, and positioned relative to the up-and-down table 63 by the end face of the bottom plate 65 abutting on the restriction portions 73A to 73C. When the lock mechanisms 74A and 74B are set to the "locked state" to cause the movable restriction member 78 to project through a cutout 63c provided at the up-and-down table 63, the restriction portions 73A to 73C and the movable restriction member 78 lock the cassette 62 by the top face 63a of the up-and-down table 63 of the bottom plate 65 of the cassette 62, so as to be incapable of shifting in the horizontal direction. That is, when the lock mechanisms 74A and 748 are in the "locked state", the cassette 62 is locked in the state being positioned relative to the up-and-down table 63. The lock mechanisms 74A and 74B are set to the "released state" only when the cassette 62 is mounted or removed.

With reference to FIGS. 1 to 4, a description will be given of the conveying unit 12. The single-arm type conveying apparatus 15 stored in the conveying chamber 19 includes a single holding fork (holding unit) 28 that can hold the tray 3 by holding around the outer circumference of the bottom face 3b of the tray 3. The holding fork 28 is coupled to a two-link type horizontal shifting mechanism 29 that can linearly shift in the horizontal direction (XY direction), and the horizontal shifting mechanism 29 is installed in a pivotal shaft 30 extending in the vertical direction. The pivotal shaft 30 can rotate about its own axis. Accordingly, the holding fork 28 can linearly shift in two directions and rotate in the horizontal plane. The horizontal driving mechanism 29 and the pivotal shaft 30 are driven by a conveying mechanism driver unit 31.

Figure 14:
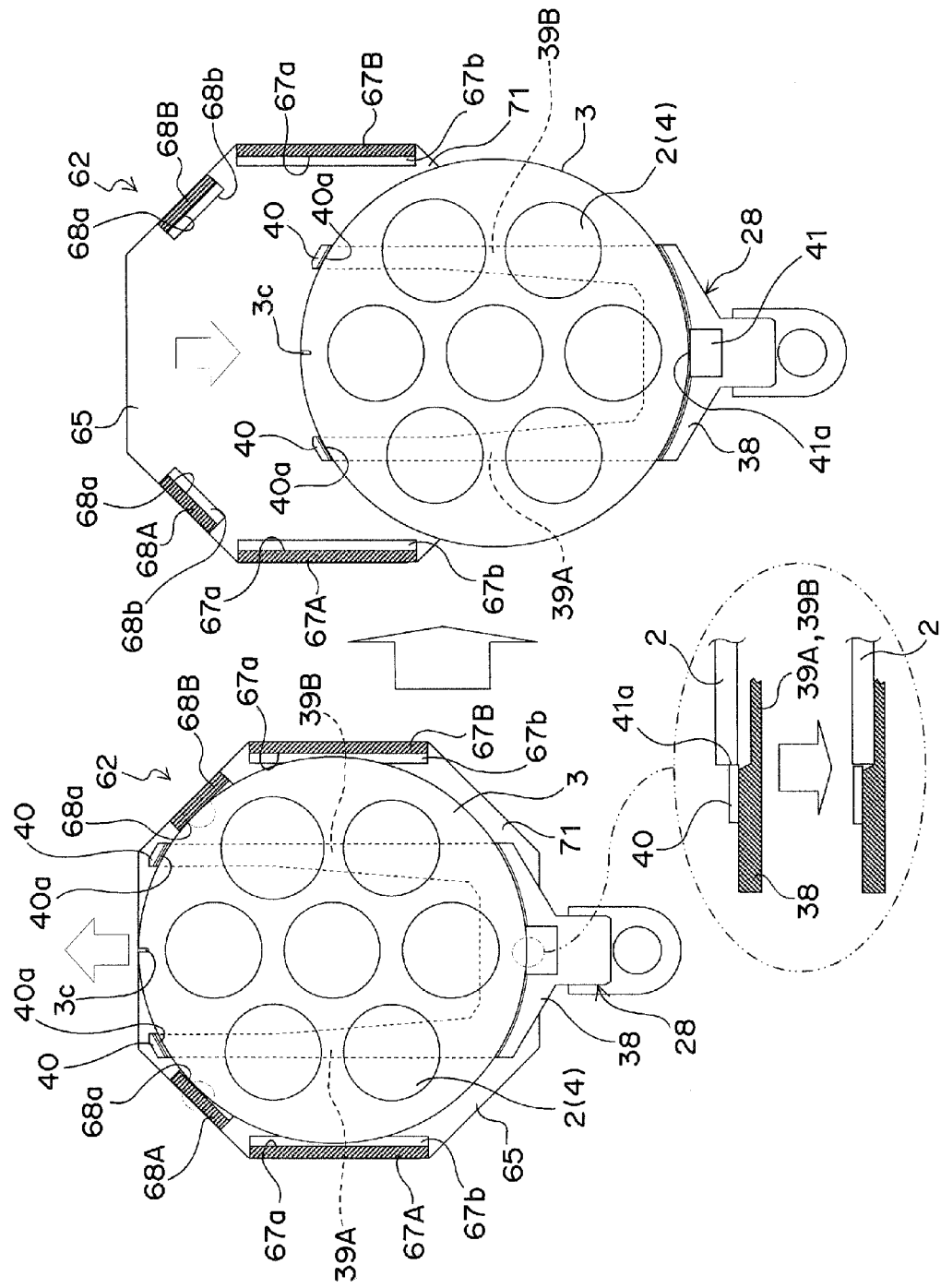
FIG. 14 is a plan view showing the tray being conveyed from the tray cassette by the conveying arms.

With reference also to FIG. 14, the holding fork 28 includes a base 38 coupled to the horizontal shifting mechanism 29, and a pair of arms 39A and 39B that extends substantially in parallel to each other from the base 38. On the arms 39A and 39B, the bottom face 3b of the tray 3 is placed. At the tip of each of the arms 39A and 39B, a projection 40 that projects upward is provided. Each projection 40 includes a restriction face 40a that abuts on the outermost circumference (which is circular in a plain view in the present embodiment) of the tray 3 to position the tray 3. On the other hand, the base 38 being the base end side of the arms 39A and 39B is similarly provided with a projection 41 that projects upward. The projection 41 is similarly provided with a restriction face 41a that abuts on the outermost circumference of the tray 3 to position the tray 3. The restriction face 40a of the projection 40 of each of the arms 39A and 39B and the restriction face 41a of the projection 41 of the base 38 oppose to each other.

With reference to FIG. 1, the conveying chamber 19 includes a substantially circular main portion 19a in a plain view. Further, the conveying chamber 19 includes substantially rectangular passage portions 19b and 19c in a plain view that respectively establish communication with the main portion 19a and the communication openings 20A and 20B. The size of the conveying chamber 19 is set to a minimum for the conveying apparatus 15 to perform required operations. First, a diameter D of the main portion 19a in a plain view is set to a minimum required dimension, in the range where the wall face of the main portion 19a and the tray 3 do not interfere with each other when the pivotal shaft 30 rotates by 360 degrees in the state where the holding fork 28 of the conveying apparatus 15 supports the tray 3. Further, a width W1 of the passage portion 19b is set to a minimum in the range where the wall face of the passage portion 19a and the tray 3 do not interfere with each other when the holding fork 28 holding the tray 3 reciprocates between the conveying chamber 19 and the processing chamber 16 passing through the communication opening 20A. Similarly, a width W2 of the communication portion 19a is set to a minimum in the range where the wall face of the passage portion 19c and the tray 3 do not interfere with each other when the holding fork 28 holding the tray 3 reciprocates between the conveying chamber 19 and the storage chamber 17 passing through the communication opening 29B.

Figure 3:
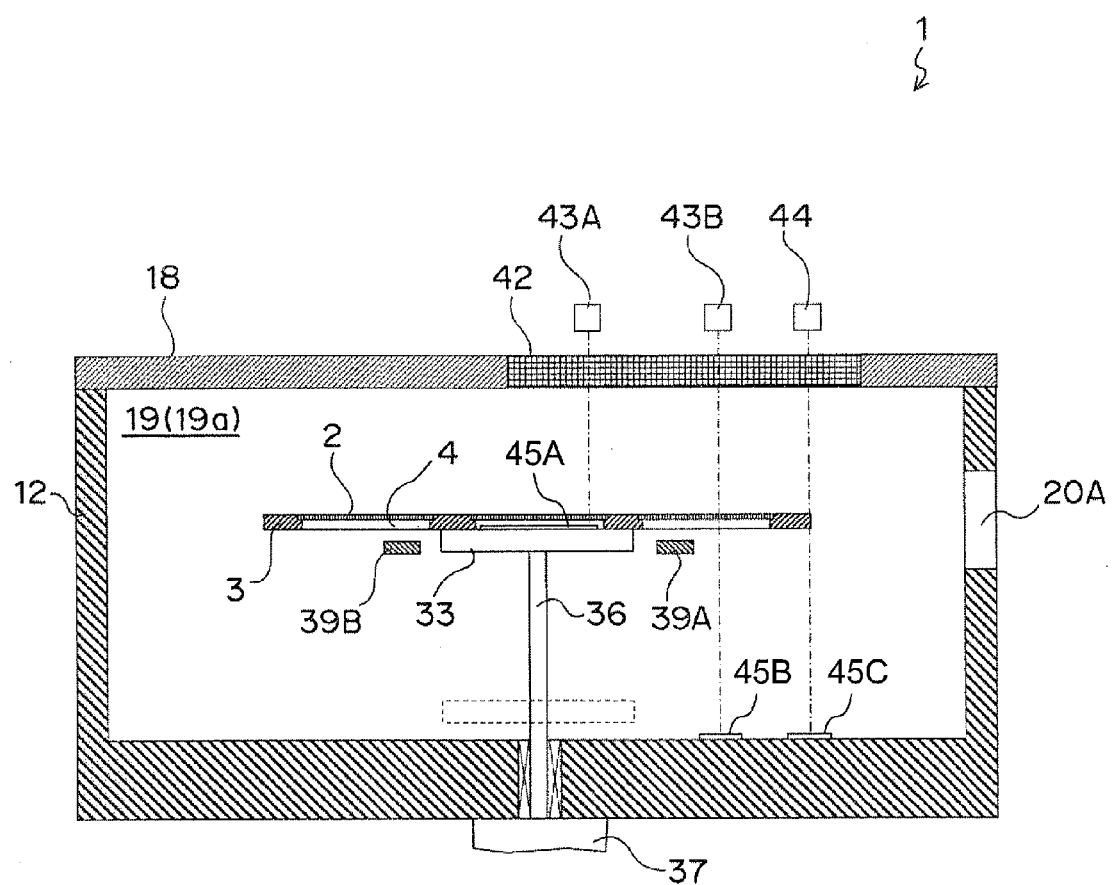
FIG. 3 is a cross-sectional view of the dry etching apparatus according to the embodiment of the present invention (line III-III shown in FIG. 13A)

With reference to FIGS. 1 to 3, a rotary stage 33 (preparatory stage) is stored in the conveying chamber 19 of the conveying unit 12. As most clearly shown in FIG. 3, the rotary stage 33 is attached to the top end of the rotary shaft 36 extending in the vertical direction. The rotary shaft 36 is driven to rotate by a rotary stage driving mechanism unit 37. As will be detailed later, the tray 3 conveyed by the conveying apparatus 15 is placed on the top face of the rotary stage 33.

With reference to FIG. 1, the rotary stage 33 is arranged on the storage chamber 17 side of the stock unit 13 in the main portion 19a (which is substantially circular in a plain view) of the conveying chamber 19. Specifically, the rotary stage 33 is arranged at the position between the pivotal shaft 30 of the conveying apparatus 15 and the storage chamber 17. More specifically, assuming that there is a virtual straight line L connecting between the center C1 of the pivotal shaft 30 of the conveying apparatus 15 and the center C2 of the storage chamber 17, the center C3 of rotation of the rotary shaft 36 of the rotation of the rotary stage 33 is positioned on the straight line L and between the center C1 and the center C2. It is to be noted that, in the present embodiment, the center C1 of the pivotal shaft substantially coincides with the center C4, in a plain view, of the main portion 19a which is circular, and the center C2 of the storage chamber 17 substantially coincides with the center C5 of the tray 3 in the cassette 62 mounted on the lifter 61 in the storage chamber 17. In other words, on the virtual straight line L, from the center C1 of the pivotal shaft 30 of the conveying apparatus 15 (the center C4 of the main portion 19a), the center C3 of the rotary shaft 36 of the rotary stage 33, the communication opening 20B, and the center C2 of the storage chamber 17 (the center C5 of the tray 3 in the storage chamber 17) are aligned in this order.

With reference to FIG. 3, the top end wall of the conveying unit 18 is provided with, at the position above the rotary stage 33, a transparent or translucent window 42. Above the window 42, two substrate detecting sensors 43A and 43B and one notch detecting sensor 44 are arranged. As shown in FIG. 1, the substrate detecting sensor 43A is positioned immediately above the center of the rotary stage 33. The substrate detecting sensor 43B is positioned as being offset from the rotary stage 33 in a plain view. The notch detecting sensor 44 is positioned on the further outer side than the substrate detecting sensor 43B relative to the rotary stage 33 in a plain view. On the rotary stage 33, a light reflecting member 45A is fixed at the position immediately below the substrate detecting sensor 43A. Similarly, on the bottom wall of the conveying unit 18, light reflecting members 45B and 45C are fixed at the positions immediately below the substrate detecting sensor 43B and the notch detecting sensor 44, respectively.

Figure 10:
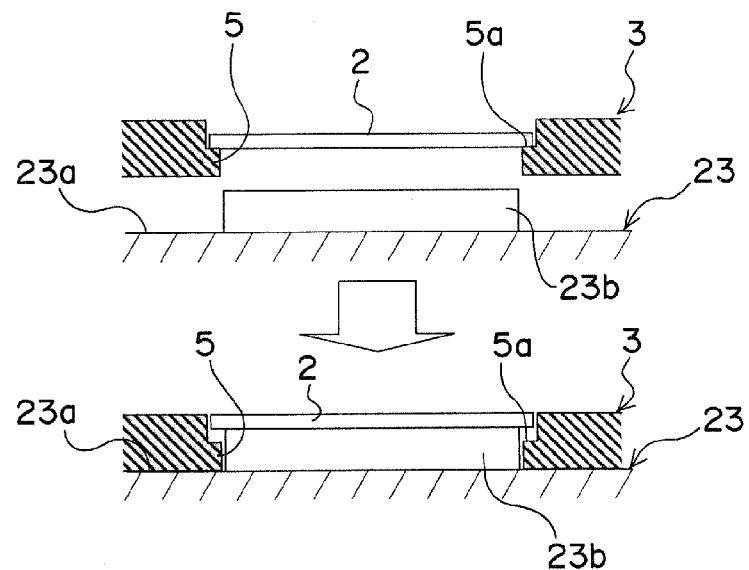
FIG. 10 is a schematic cross-sectional view of a substrate susceptor and a tray.
Figure 15:
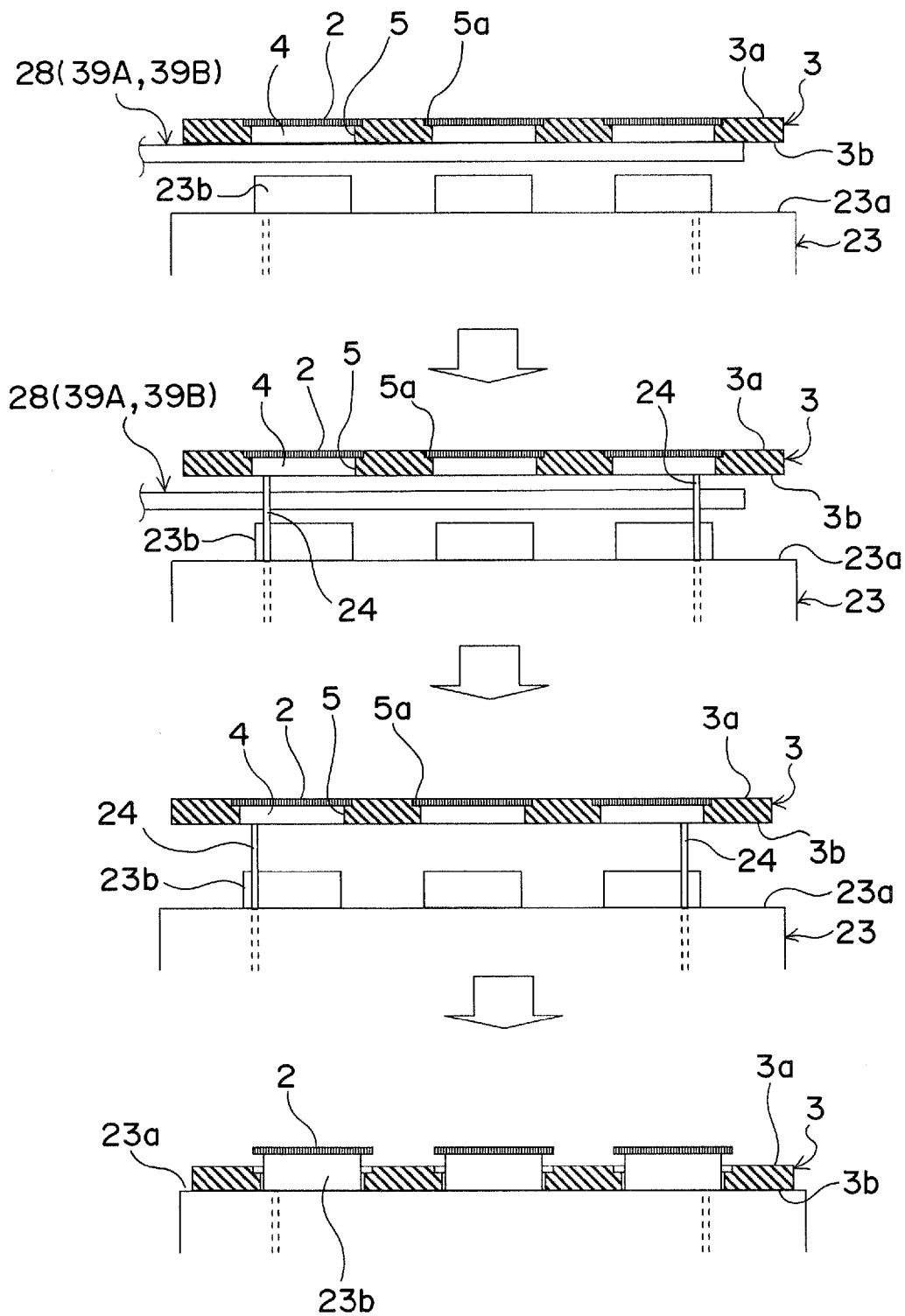
FIG. 15 is a schematic cross-sectional view for describing placement of the tray and the substrates onto the substrate susceptor.

In the plasma processing unit 11, the tray 3 on which the substrates 2 are placed is stored in the processing chamber 16, and etching is performed. Here, the etching scheme or the like is not particularly limited. For example, the plasma processing unit 11 may be an ICP type or a parallel plate type. With reference to FIGS. 1, 10, and 15, in the plasma processing unit 11 according to the present embodiment, on the bottom portion side of the processing chamber 16, a stage 23 is provided. On a top end face 23a of the stage 23, the bottom face 3b of the tray 3 is placed. At the top end face 23a of the stage 23, substrate retaining portions 23b being flat columnar electrostatic chucks project as many as (seven in the present embodiment) the substrate accommodating holes 4 of the tray 3. Further, up-down rods 24 are provided for passing the tray 3 between the holding fork 28 of the substrate conveying mechanism 15 and the stage 23.

Figure 4:
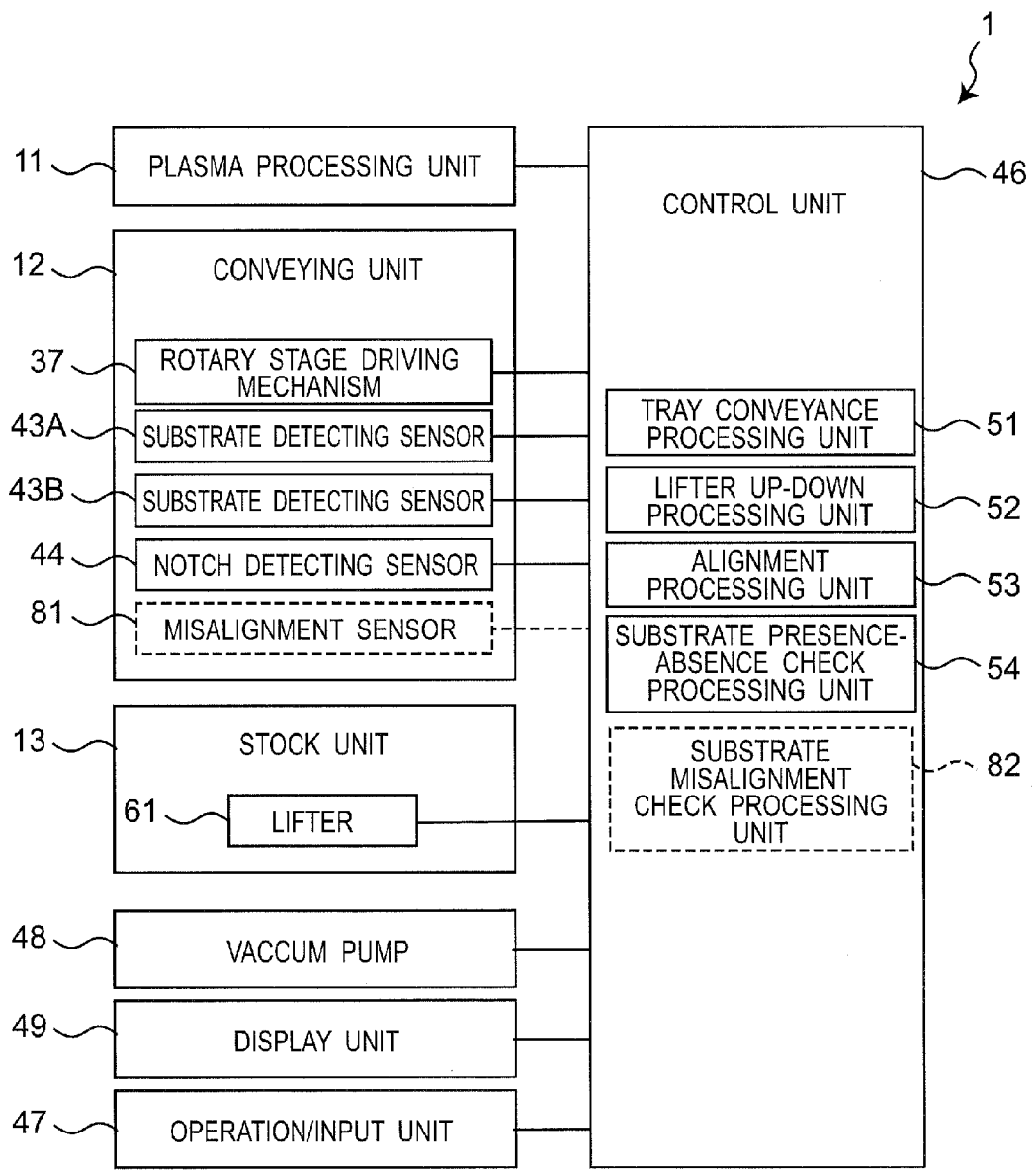
FIG. 4 is a block diagram of the dry etching apparatus according to the embodiment of the present invention.

The dry etching apparatus 1 includes a control unit 46 that is shown only in FIG. 4. The control unit 46 controls operations of the entire apparatus including the plasma processing unit 11, the conveying apparatus 15, the vacuum pump 48, and the display unit 49 based on, e.g., inputs from various sensors including the substrate detecting sensors 43A and 43B, the notch detecting sensor 44 and the like, in addition to the instruction of the operator input from an operation-input unit 47. In particular, the control unit 46 includes a tray conveyance processing unit 51 that controls conveyance of the tray 3 performed by the conveying mechanism 15, a lifter up-down processing unit 52 that controls raising and lowering operation of the up-and-down table 63 of the lifter 61 performed by the lifter driving mechanism 64, an alignment processing unit 53 that controls the alignment processing performed by the rotary stage 26 and the notch detecting sensor 44, and a substrate presence-absence check processing unit 54 that controls presence and absence checking of the substrate 2 performed by the substrate detecting sensors 43A and 43B.

Next, a description will be given of the operation of the dry etching apparatus 1 according to the present embodiment.

Figure 12:
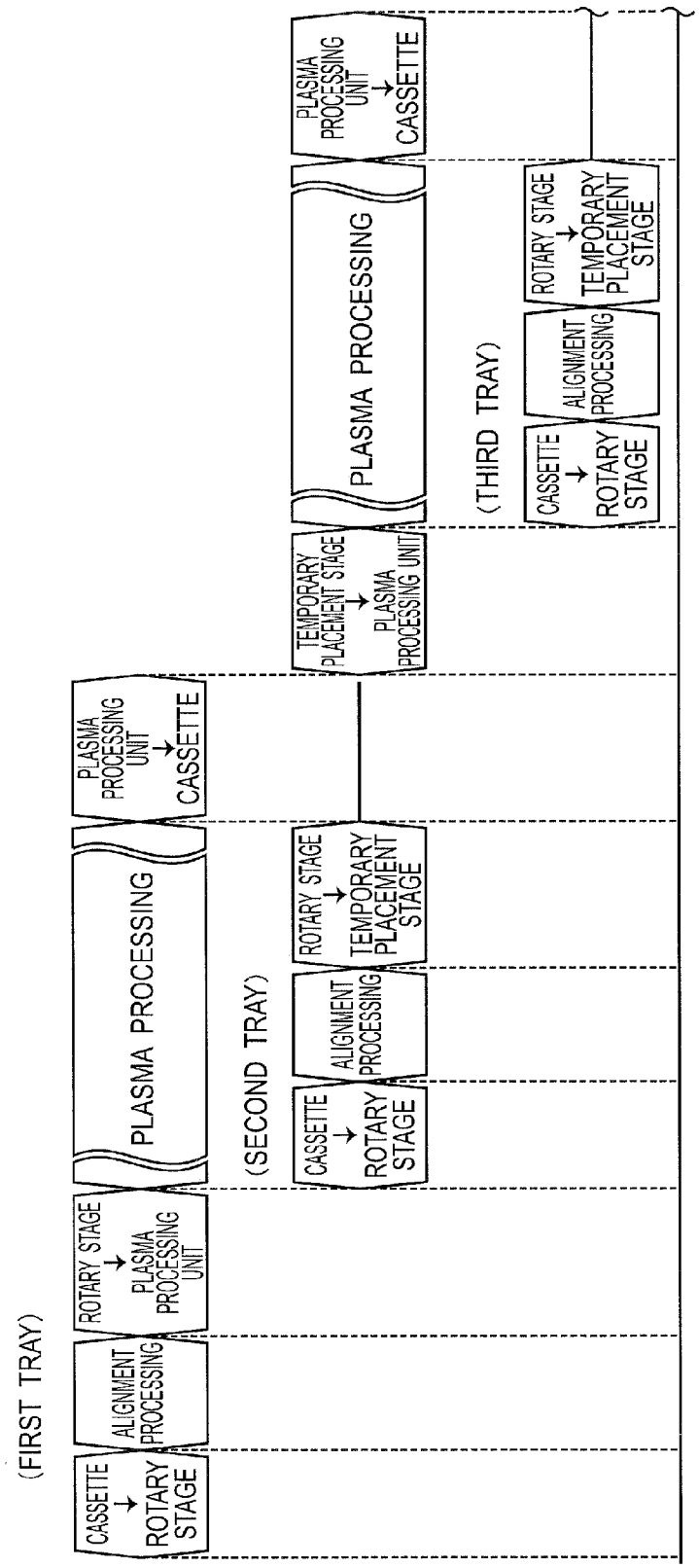
FIG. 12 is a time chart showing the operation of the dry etching apparatus according to the embodiment of the present invention.

With reference to FIG. 12, after operation of the dry etching apparatus 1 is started, the first tray 3 is conveyed by the conveying apparatus 15 from any main shelf portions 67b and 68b of the cassette 62 in the storage chamber 17 of the stock unit 13 to the conveying chamber 19 of the conveying unit 12, and is placed on the top face of the rotary stage 33. Next, to the tray 3 placed on the rotary stage 33, adjustment of the rotational angular position, that is, the alignment processing, is performed by the rotation of the rotary stage 33. Thereafter, the tray 3 is conveyed by the conveying apparatus 15 from the conveying chamber 19 into the processing chamber 16 of the plasma processing unit 11 via the conveying chamber 16, and placed on the stage 23. By the tray 3 being arranged on the stage 23, plasma processing is performed to the substrates 2 placed on the substrate holding faces 5a of the substrate holding portions 5. After the plasma processing, the tray 3 is conveyed by the conveying apparatus 15 from the processing chamber 16 to the storage chamber 17 via the conveying chamber 19, and is collected onto the vacant main shelf portions 67b and 68b of the cassette 62.

Further, with reference to FIG. 12, the second and the following trays 3 after the operation of the dry etching apparatus 1 has started are each conveyed by the conveying apparatus 15 from any main shelf portions 67b and 68b of the cassette 62 in the storage chamber 17 of the stock unit 13 to the conveying chamber 19 of the conveying unit. 12, and placed on the top face of the rotary stage 33. Next, to the tray 3 placed on the rotary stage 33, adjustment of the rotational angular position, that is, the alignment processing is performed by the rotation of the rotary stage 33. The tray 3 after being subjected to the alignment processing is conveyed by the conveying apparatus 1.5 from the conveying chamber 19 to the storage chamber 17, and placed on the temporary placement shelf portions 67c and 68c of the cassette 62. Thereafter, the tray 3 is taken out by the conveying apparatus 15 from the temporary placement shelf portions 67c and 68c, and conveyed from the storage chamber 17 into the processing chamber 16 of the plasma processing unit 11 via the conveying chamber 16, and placed on the stage 23. By the tray 3 being arranged on the stage 23, plasma processing is performed to the substrates 2 placed on the substrate holding faces 5a of the substrate holding portions 5. After the plasma processing, the tray 3 is conveyed by the conveying apparatus from the processing chamber 16 to the storage chamber 17 via the conveying chamber 19, and is collected onto the vacant main shelf portions 67b and 68b of the cassette 62.

In the following, the operation of the dry etching apparatus 1 will be described in more detail focusing on the second and following trays 3.

Figure 13A:
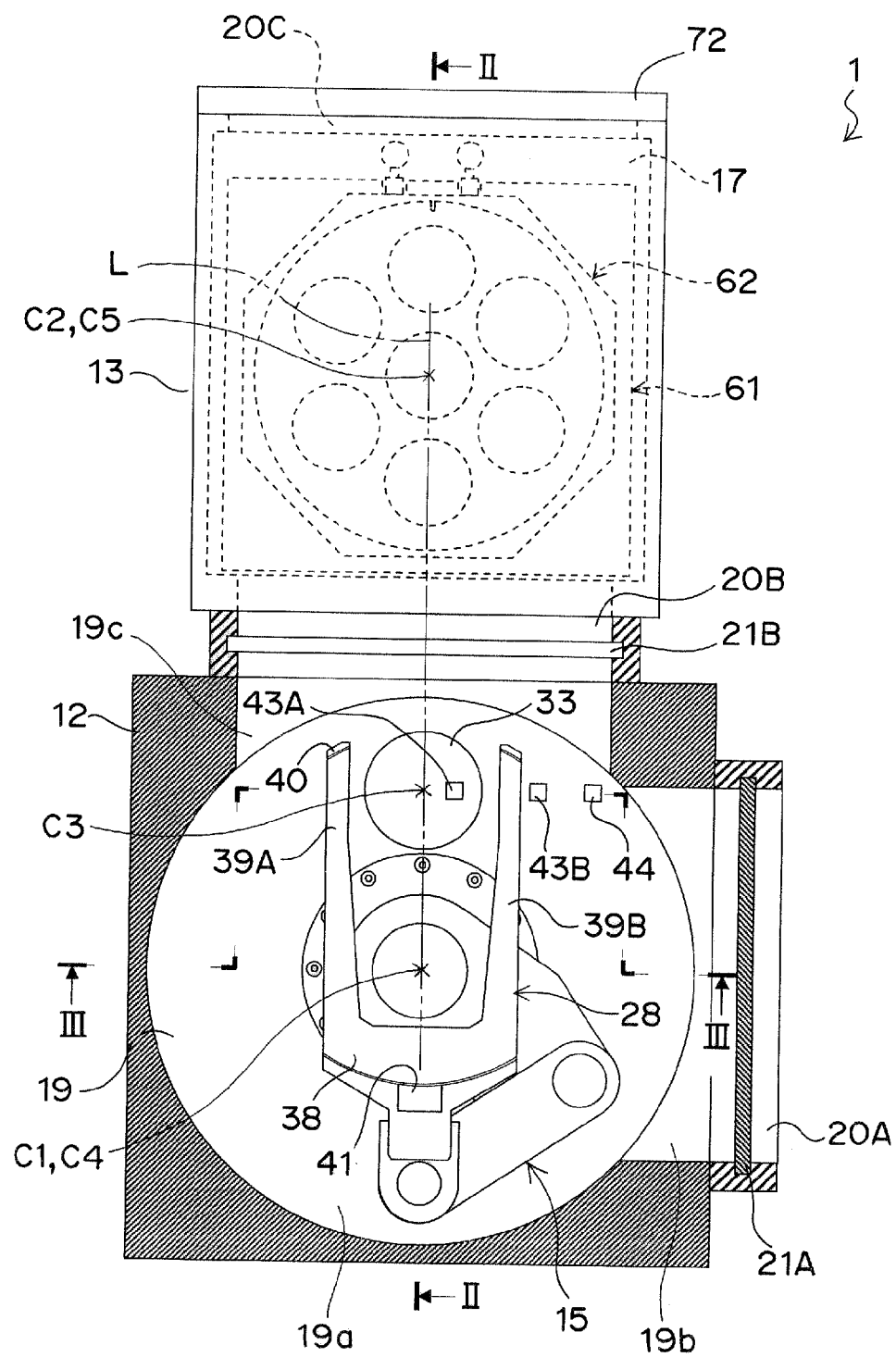
FIG. 13A is a horizontal cross-sectional view of the dry etching apparatus before conveying arms entering a tray stock unit from a conveying unit.
Figure 13B:
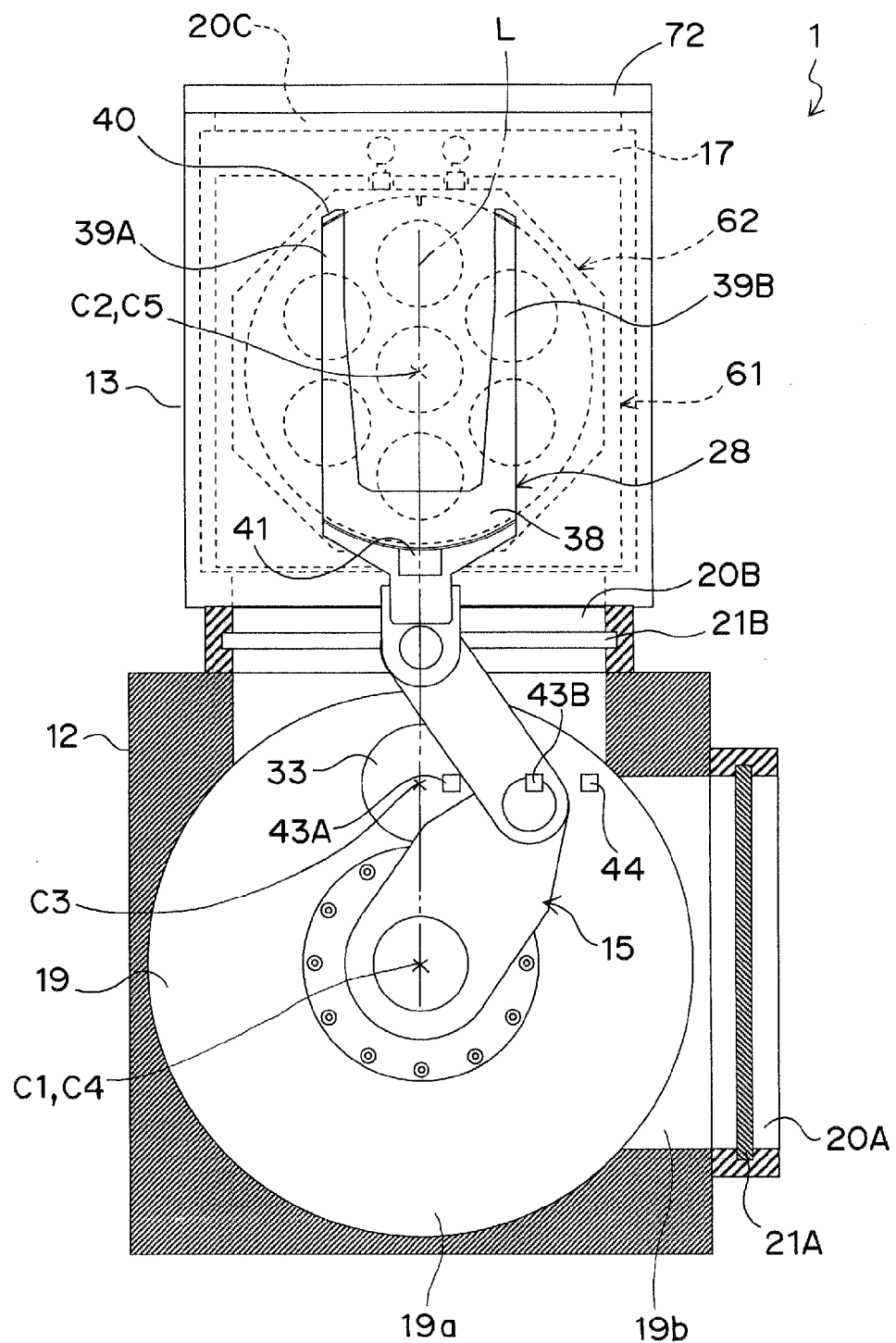
FIG. 13B is a horizontal cross-sectional view of the dry etching apparatus when the conveying arms are entering the tray stock unit.

As shown in FIG. 13A, the holding fork 28 directed to the storage chamber 17 by the rotation of the pivotal shaft 30 enters the storage chamber 17 of the stock unit 13 from the conveying chamber 19 of the conveying unit 12 through the communication opening 20B by the linear shifting of the shifting mechanism 29 as shown in FIG. 13B, and holds the tray 3 (which accommodates seven substrates 2 before subjected to processing) held on any main shelf portions 67b and 68b of the cassette 62. With reference also to FIG. 14, the arms 39A and 39B of the holding fork 28 advance from the inlet/outlet opening 71 into the cassette 62, and are inserted to the bottom face 3b of the tray 3 at an interval. Next, by the cassette 62 mounted on the up-and-down table 63 of the lifter 61 by the lifter driving mechanism 64 being lowered, the tray 3 is passed from the main shelf portions 67*b* and 68*b* to the arms 39A and 39B of the holding fork 28. Specifically, the bottom face 3*a* of the tray 3 having been held by the main shelf portions 67*b* and 68*b* is held by the top face of the arms 39A and 39B of the holding fork 28 as the cassette 62 being lowered. At this time, by being fitted between the restriction faces 40*a* of the projections 40 of the arms 39A and 39B and the restriction faces 41*a* of the projections 41 of the base 38, centering (alignment relative to the holding fork 28 in the horizontal plane) of the tray 3 with reference to the holding fork 28 (arms 39A and 39B) is achieved.

Figure 13C:
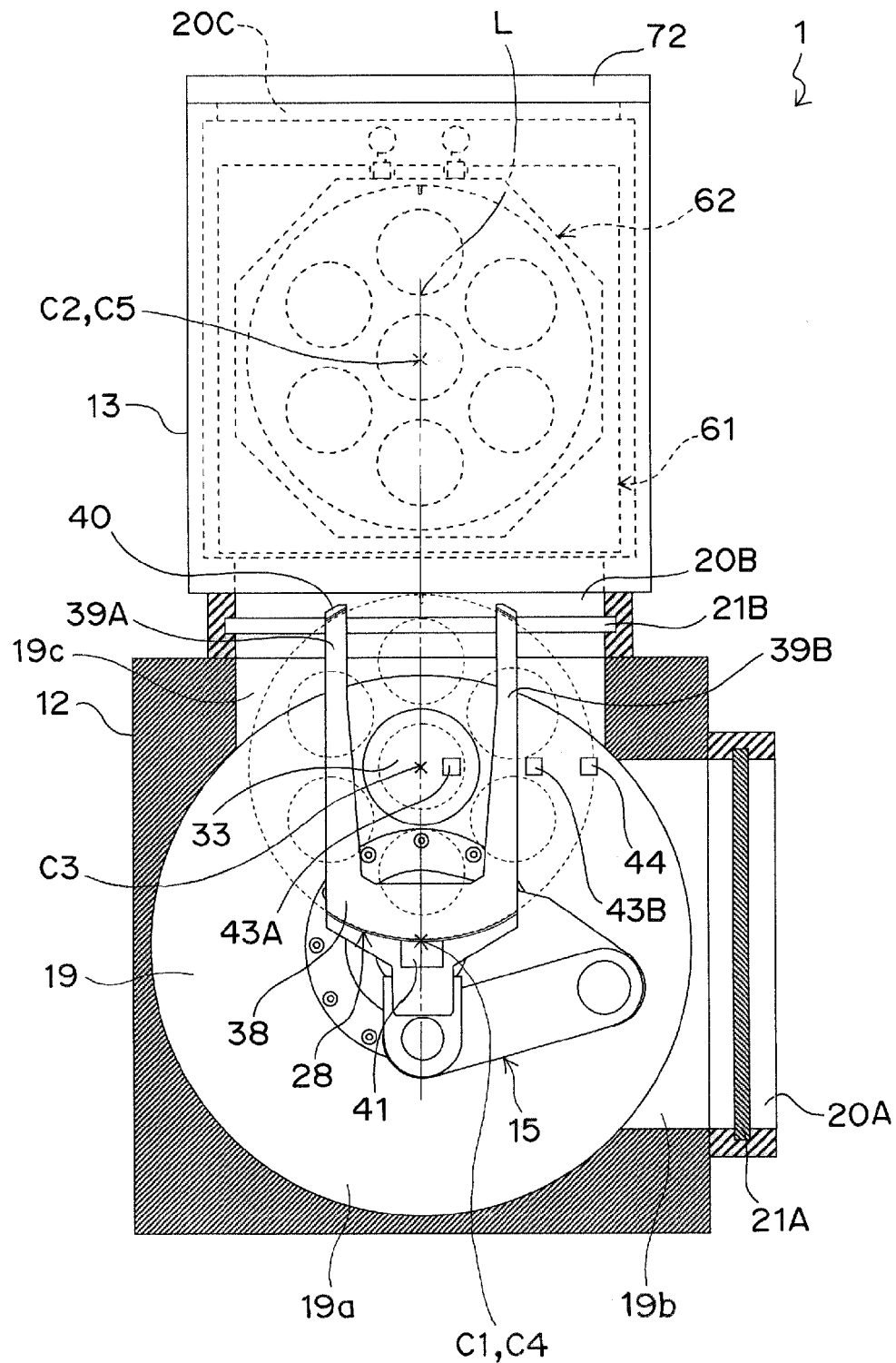
FIG. 13C is a horizontal cross-sectional view of the dry etching apparatus when the substrates are processed at the rotary table.

The holding fork 28 having received the tray 3 from the main shelf portions 67*b* and 68*b* of the cassette 62 recedes from the cassette 62 passing through the inlet/outlet opening 71 (see FIG. 14), and returns to the conveying chamber 19 from the storage chamber 17 through the communication opening 208. As shown in FIG. 13C, the holding fork 28 shifts such that the tray 3 is positioned above the rotary stage 33. Subsequently, by the upward movement of the rotary shaft 36, the rotary stage 33 rises. The rotary stage 33 projects upward than the holding fork 28 passing through between the two arms 39A and 39B of the holding fork 28, whereby the tray 3 is placed on the top face of the rotary stage 33.

Subsequently, the rotational angular position of the tray 3 arranged on the rotary stage 33 is adjusted by the rotary shaft 36 causing the rotary stage 33 to rotate. When the rotational angular position is adjusted, the notch 3*c* is detected by the output of the notch detecting sensor 44, and the rotary stage 33 is rotated accordingly. Further, by the output from the substrate detecting sensors 43A and 43B being monitored as the rotary stage 33 is rotated by the rotary shaft 36, it can be checked that the substrates 2 are accommodated in the substrate accommodating holes 4 of the tray 3. Presence or absence of the substrate 2 in the substrate accommodating hole 4 at the center of the tray 3 can be checked by the output from the substrate detecting sensor 43A, and the substrates 2 in the other six substrate accommodating holes 4 of the tray 3 can be checked by the output from the substrate detecting sensor 43B. The notch detecting sensor 44 together with the above-described alignment processing unit 53 of the control unit 46 constitutes the preliminary processing unit of the present invention. Further, the substrate sensors 43A and 43B together with the above-described alignment processing unit 53 of the control unit 46 constitutes the preliminary processing unit of the present invention.

As clearly shown FIG. 13C, in adjusting the rotational angular position and checking presence or absence of the substrates, the tray 3 on the rotary stage 33 is not entirely stored in the main portion 19*a* of the conveying chamber 19. Instead, the tray 3 partially enters the communication opening 20B between the conveying chamber 19 and the storage chamber 17 through the passage portion 19*b* of the conveying chamber 19. In this manner, effective use of not only the main portion 19*a* of the conveying chamber 19 but also the passage portion 19*b* and the communication opening 20B enables the adjustment of the rotational angular position of the tray 3 on the rotary stage 33 and the presence and absence checking of the substrates arranged at the main portion 19*a* of the conveying chamber 19, by setting the size of the conveying chamber 19 to the minimum required dimension for the conveying apparatus 15 to perform the required operation, as described above. In other words, use of not only the main portion 19*a* of the conveying chamber 19 but also the passage portion 19*b* and the communication opening 208 eliminates the necessity of provision of a chamber dedicated to store the rotary stage 33. The effective use of the passage portion 19*b* and the communication opening 20B in adjusting the rotational angular position of the tray 3 on the rotary stage 33 and checking whether the substrates are present or absent is realized by the arrangement of the rotary stage 33 at the position between the pivotal shaft 30 of the conveying apparatus and the storage chamber 17, as has been described in detail with reference to FIG. 1.

After adjusting the rotational angular position and checking whether the substrates are present or absent, the rotary stage 33 is lowered by the downward movement of the rotary shaft 36, and the tray 3 is passed from the rotary stage 33 to the holding fork 28.

The holding fork having received the tray 3 from the rotary stage 33 is directed to the storage chamber 17 of the stock unit 13 by the rotation of the pivotal shaft 30. The holding fork 28 enters the storage chamber 17 through the communication opening 20B. By the operation which is reverse to that of conveying the tray 3 from the main shelf portions 67*b* and 68*b* to the support arm 28 described with reference to FIG. 14, the tray 3 is transferred from the holding fork 28 to the vacant temporary placement shelf portions 67*c* and 68*c* of the cassette 62. That is, the holding fork 28 holding the tray 3 enters the cassette 62 from the inlet/outlet opening 71, and the tray 3 is arranged on the temporary placement shelf portions 67*c* and 68*c*. Next, by the cassette 62 mounted on the up-and-down table 63 of the lifter 61 being raised by the lifter driving mechanism 64, the tray 3 is passed from the arms 39A and 39B of the holding fork 28 to the temporary placement shelf portions 67*c* and 68*c*.

With reference to FIG. 12, the above-described processing for the second and following trays 3, that is, conveyance from the main shelf portions 67*b* and 68*b* of the cassette 62 to the rotary stage 33, the alignment processing (rotational angular position adjustment) on the rotary stage 33, and the conveyance of each of the second and following trays 3 from the rotary stage 33 to the temporary placement shelf portions 67*c* and 68*c* of the cassette 62 are performed while the one preceding tray 3 is subjected to the plasma processing. Further, when the conveyance of the one preceding tray 3 from the processing chamber 16 of the plasma processing unit 11 to the main shelf portions 67*b* and 68*b* of the cassette 62 has finished, the following processing is performed.

First, by the rotation of the pivotal shaft 30, the holding fork 28 is directed to the storage chamber 17 of the stock unit 13. The holding fork 28 enters the storage chamber 17 passing through the communication opening 20B, and is inserted on the bottom side of the bottom face 3*b* of the tray 3 held by the temporary placement shelf portions 67*c* and 68*c* at an interval. Next, the lifter driving mechanism 64 lowers the cassette 62 mounted on the up-and-down table 63 of the lifter 61, whereby the tray 3 is passed from the temporary placement shelf portions 67*c* and 68*c* to the arms 39A and 39B of the holding fork 28.

Figure 13D:
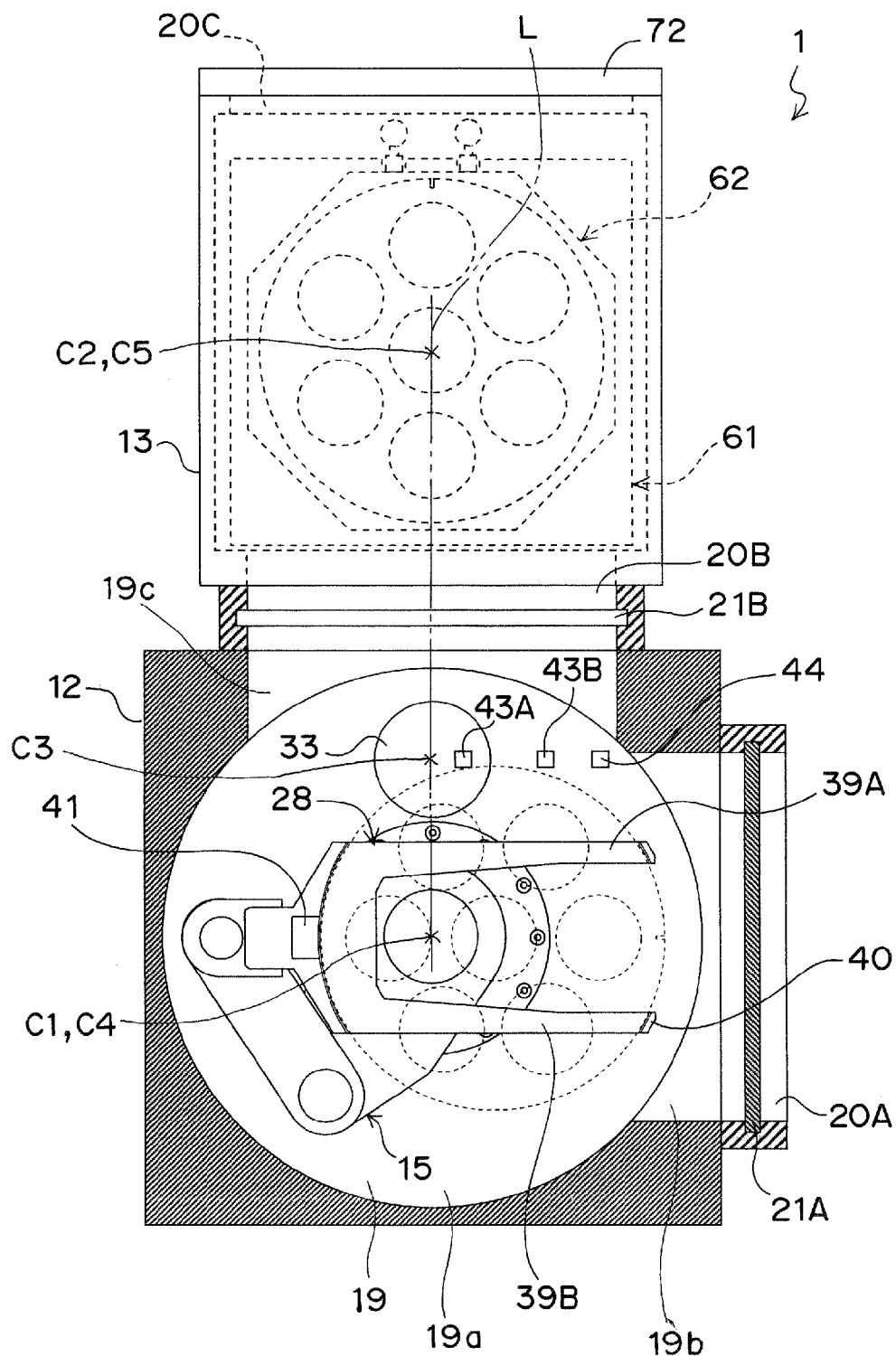
FIG. 13D is a horizontal cross-sectional view of the dry etching apparatus before the conveying arms entering the plasma processing unit from the conveying unit.

As shown in FIG. 13D, the holding fork 28 having received the tray 3 rotates in the conveying chamber 19, and is directed to the processing chamber 16 of the plasma processing unit 11. Thereafter, the gate valve 21A is switched from the closed state to the open state, and the communication opening 20A is opened.

Further, the tray 3 is placed on the stage 23 by the operation shown in FIG. 15. First, the support arm 28 enters the processing chamber 17 via the communication opening 20A, and is arranged above the stage 23. Next, the up-down rods 24 rise, whereby those top ends push up the bottom face 3*b* of the tray 3. This causes the support arm 28 to pass the tray 3 to the up-down rods 24. Thereafter, the up-down rods 24 lower, and the tray 3 is placed on the top end face 23*a* of the stage 23.

With reference also to FIG. 10, in accordance with the tray 3 being lowered to the top end face 23a of the stage 23, the substrate retaining portion 23b enters the substrate accommodating hole 4 from the bottom face 3b side of the tray 3. Accordingly, when the tray 3 is placed on the top end face 23a of the stage 23, the substrate 2 in each of the substrate accommodating holes 4 is lifted from the substrate holding face 5a of the substrate holding portion 5, and placed on the top end of the substrate retaining portion 23b.

When the arrangement of the tray 3 to the stage 23 has finished, the plasma etching processing to the substrate 2 is performed.

After the etching processing, by the operation which is reverse to the operation of placing onto the stage 23 having been described with reference to FIG. 15, the holding fork 28 receives the tray 3 from the stage 23 in the processing chamber 16, and returns to the conveying chamber 19. The holding fork 28 holding the tray 3 rotates in the conveying chamber 19 and is directed to the storage chamber 17 of the stock unit 13. The holding fork 28 enters storage chamber 17 through the communication opening 20B. By the operation which is reverse to the operation of transferring the tray 3 from the main shelf portions 67b and 68b to the support arm 28 having been described with reference to FIG. 14 (i.e., the operation being similar to the operation of transferring the tray 3 from the support arm 28 to the temporary placement shelf portions 67c and 68c), the tray 3 is transferred from the holding fork 28 to the vacant main shelf portions 67b and 68b of the cassette 62.

The dry etching apparatus 1 according to the present embodiment is characterized by the following points.

First, while the dry etching processing is performed in the processing chamber 16 of the plasma processing unit 11 for the substrates 2 of one tray 3, conveyance of the next one tray 3 from the main shelf portions 67b and 68b of the cassette 62 to the rotary stage 33, rotation of the rotary stage 33, rotational angular position adjustment of the tray 3 by the notch detecting sensor 44 (substrate presence-absence sensing is simultaneously performed by the substrate detecting sensors 43A and 43B), and conveyance of the cassette 62 from the rotary stage 33 to the temporary placement shelf portions 67c and 68c are performed. Accordingly, high throughput can be achieved while employing the single-arm type conveying apparatus 15 whose structure is simple and cost-effective.

Next, the mechanism for temporarily placing the tray 3 having been subjected to the rotational angular position adjustment (substrate presence-absence sensing by the substrate detecting sensors 43A and 43B) and before being subjected to the dry etching processing in the processing chamber 16 of the plasma processing unit 11 is provided at the processing chamber 17 stored in the storage chamber 16 of the stock unit 13 as the temporary placement shelf portions 67c and 68c. Accordingly, it is not necessary to separately provide a chamber dedicated to temporary placement, and hence a reduction in both the size of the dry etching apparatus and the installation area can be achieved.

Further, the rotational angular position adjustment of the tray 3 being the preliminary processing that must be performed before dry etching processing in the processing chamber 16 of the plasma processing unit 11 and the substrate presence-absence sensing are performed at the rotary stage 33 (the notch detecting sensor 44 and the substrate detecting sensors 43A and 43B) stored in the conveying chamber 19 for storing the conveying apparatus 15, it is not necessary to separately provide a chamber dedicated to the preliminary processing. In this regard also, a reduction in both the size of the dry etching apparatus and the installation area can be achieved.

Further, by the cassette 62 being raised and lowered by the lifter 61, the exchange of the tray 3 between the main shelf portions 67b and 68b and the holding fork 28 and the exchange of the tray 3 between the holding fork 28 and the temporary placement shelf portions 67c and 68c can be realized. Accordingly, the holding fork 28 of the single-arm type conveying apparatus 15 is only required to be capable of horizontal directional shifting by the horizontal shifting mechanism 29 and rotating by the pivotal shaft 30. That is, it is not necessary for the holding fork 28 to be provided with the up-and-down function, and hence the structure of the conveying apparatus 15 can be simplified.

The present invention is not limited to the embodiment described above, and various modifications can be made.

As shown in FIG. 4, a misalignment sensor 81 (e.g., a sensor that measures the distance from a certain position to the substrate 2) for optically detecting the misalignment of the substrate 2 relative to the tray 3 may be provided, and whether or not each substrate 2 is misaligned relative to the tray 3 may be determined by a substrate misalignment check processing unit 82 of the control unit 46 based on the output of the misalignment sensor 18.

Figure 16:
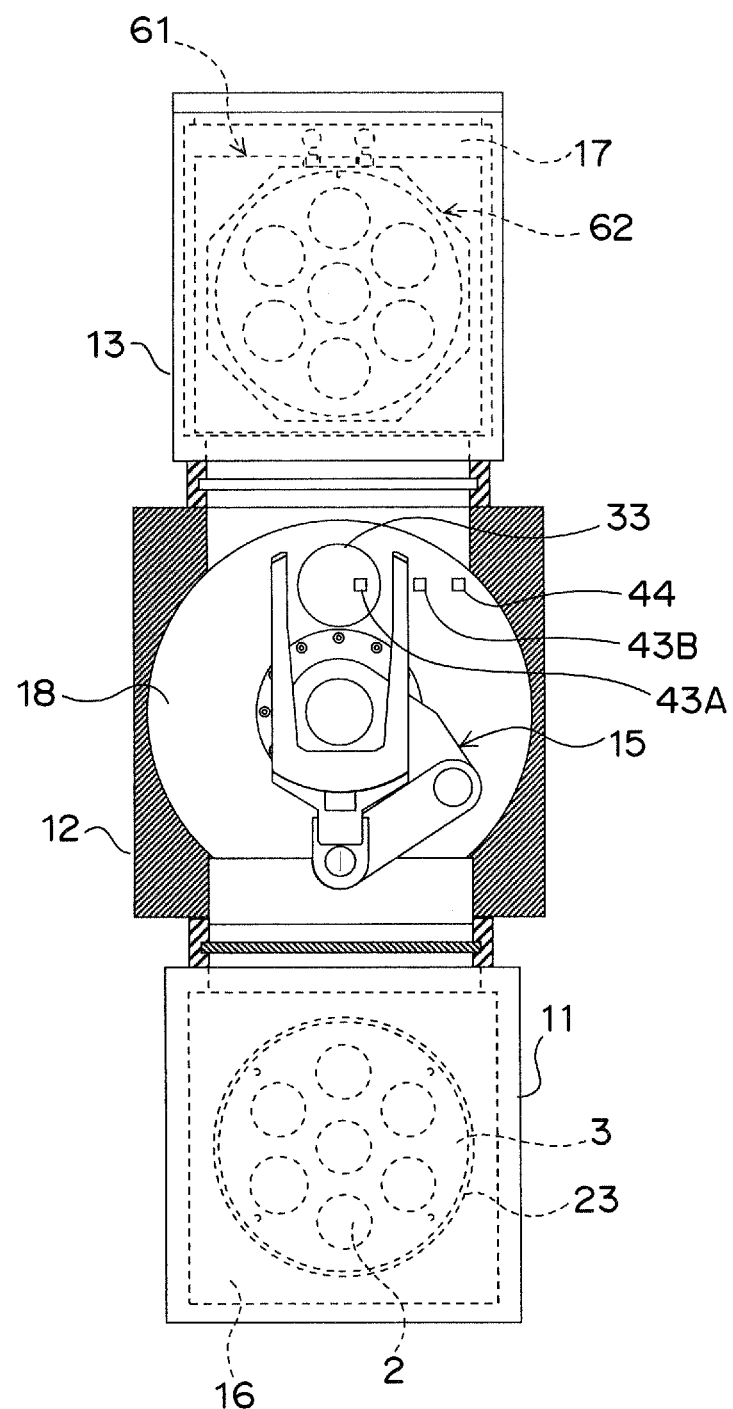
FIG. 16 is a horizontal cross-sectional view of a dry etching apparatus according to a variation of the present invention.

The arrangement of the plasma processing unit 11, the conveying unit 12, and the stock unit 13 in a plain view is not limited to an L-shaped arrangement (FIG. 1) as in the embodiment. For example, as the dry etching apparatus 1 according to a variation shown in FIG. 16, the plasma processing unit 11 and the stock unit 13 may be arranged on the opposing sides with reference to the conveying unit 12, such that the plasma processing unit 11, the stock unit 13, and the conveying unit 12 become substantially linear in a plain view.

Similarly, the specific structure as to the stock unit 13 is not limited to that of the embodiment. For example, the dry etching apparatus 1 according to a variation shown in FIG. 17 includes a transfer unit 83 provided as being adjacent to the stock unit 13. From the transfer unit 83, the tray 3 storing the substrates 2 before being processed is supplied to the stock unit 13, and the tray 3 is returned from the stock unit 13 to the transfer unit 71 after the substrates 2 are processed. In the stock unit 13, a temporary placement unit (not shown) for arranging the tray 3 after being subjected to alignment is provided. In a transfer chamber 84 in the transfer unit 83, a transfer robot 85 is stored.

Figure 17:
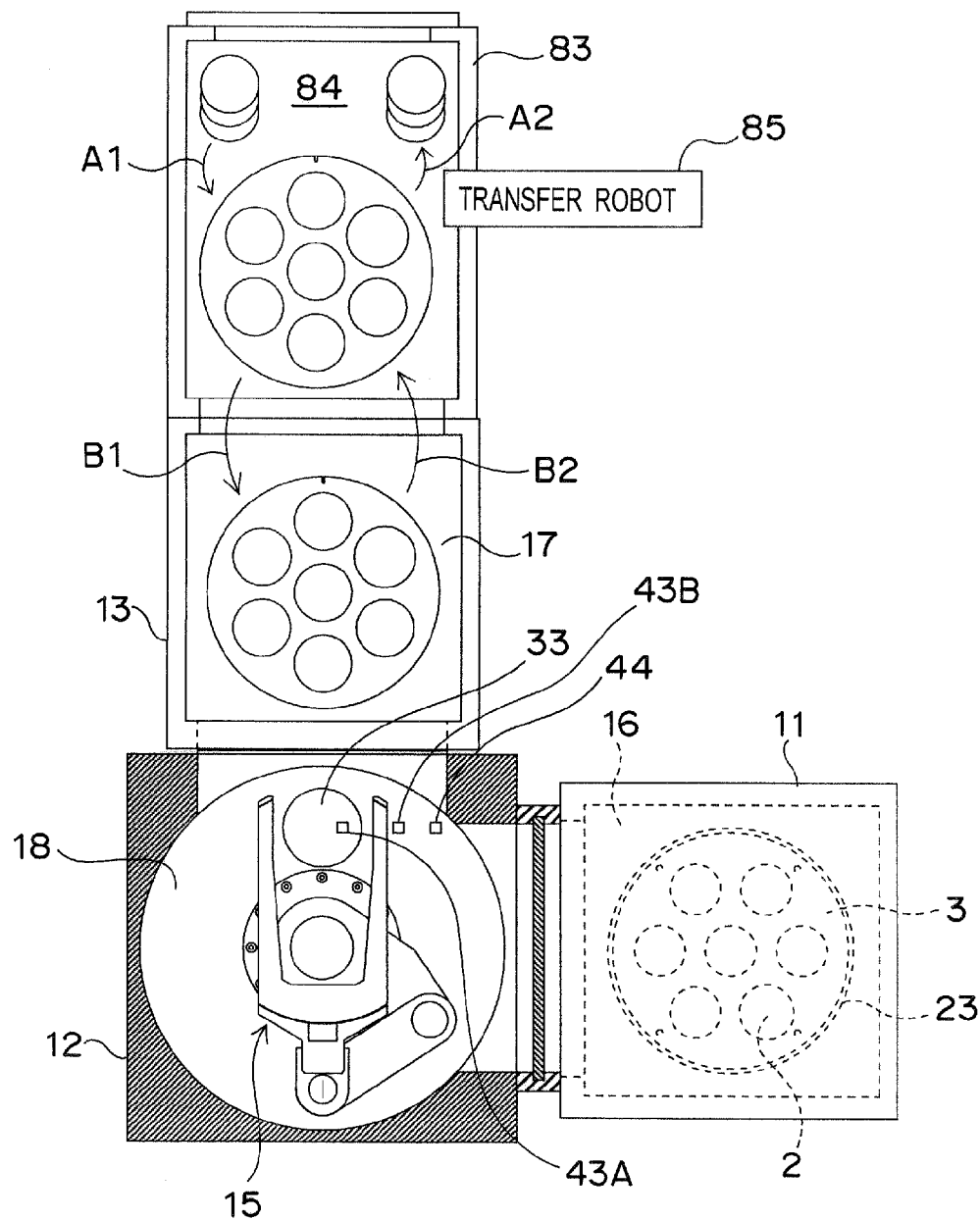
FIG. 17 is a horizontal cross-sectional view of a dry etching apparatus according to another variation of the present invention.

As conceptually represented by arrow A1 in FIG. 17, the transfer robot 85 performs the work of accommodating the substrates 2 before being subjected to dry etching in the substrate accommodating holes 4 of the tray 3, that is, the work of transferring the substrates 2 to the tray 3. Further, as conceptually represented by arrow A2 in FIG. 17, the transfer robot 85 performs the work of transferring the substrates 2 after being subjected to the dry etching from the tray 3. Still further, the transfer robot 85 performs the work of conveying the tray 3 accommodating the substrates 2 before being processed from the transfer unit 83 into the stock unit 13 (arrow B1 in FIG. 17) and the work of conveying the tray 3 accommodating the substrates 2 after being processed from the stock unit 13 to the transfer unit 83 (arrow B2 in FIG. 14).

The tray may be provided with bottomed substrate accommodating holes. Further, the present invention is not limited to the case where the substrates are accommodated in the tray. For example, the present invention can be applied to a large substrate itself that corresponds to the tray 3 in the embodiment. Further, the present invention is not limited to the dry etching apparatus, and can be applied to other plasma processing apparatus such as a CVD apparatus.

It is to be noted that, combinations of any of various embodiments described above can exhibit their respective effects.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The entire disclosure of Japanese Patent Application No. 2011-89262 filed on Apr. 13, 2011, including specification, claims, and drawings are incorporated herein by reference in its entirety.

DESCRIPTION OF SYMBOLS 1 dry etching apparatus
2 substrate
3 tray
3a top face
3b bottom face
3c notch
4 substrate accommodating hole
5 substrate holding portion
5a substrate holding face
11 plasma processing unit
12 conveying unit
13 stock unit
15 conveying apparatus
16 processing chamber
17 storage chamber
19 conveying chamber
20A, 20B, 20C communication opening
21A, 21B gate valve
23 stage
23a top end face
23b substrate retaining portion
24 up-down rod
28 holding fork
29 horizontal shifting mechanism
30 pivotal shaft
31 conveying mechanism driver unit
33 rotary stage
36 rotary shaft
37 rotary stage driving mechanism
38 base
39A, 39B arm
40 projection
40a restriction face
41 projection
41a restriction face
42 window
43A, 43B substrate detecting sensor
44 notch detecting sensor
45A, 45B, 45C light reflecting member
46 control unit
47 operation-input unit
48 vacuum pump
49 display unit
51 tray conveyance processing unit
52 lifter up-down processing unit
53 alignment processing unit
54 substrate presence-absence check processing unit
61 lifter
62 cassette
63 up-and-down table
63a top face
63b bottom face
63c cutout
64 lifter driving mechanism
65 bottom plate
66 top plate
66a handle
67A, 67B main shelf plate member
67a inner face
67b main shelf portion
67c temporary placement shelf portion
68A, 68B sub-shelf plate member
68a inner face
68b main shelf portion
68c temporary placement shelf portion
71 inlet/outlet opening
72 door
73A, 73B, 73C restriction portion
74A, 74B lock mechanism
75 bearing portion
76 rod
77 spring
78 movable restriction member
79 knob
81 misalignment sensor
82 substrate misalignment check processing unit
83 transfer unit
84 transfer chamber
85 transfer robot

The invention claimed is:

1. A plasma processing method, comprising:
conveying a target object of plasma processing stored in a stock unit by a conveying apparatus stored in a conveying unit to a preparatory stage stored in the conveying unit;
performing preliminary processing for the plasma processing to the target object placed on the preparatory stage;
conveying the target object having undergone the preliminary processing by the conveying apparatus to the plasma processing unit and performing the plasma processing; and
conveying the target object having undergone the plasma processing from the plasma processing unit to the stock unit,
wherein the preparatory stage is arranged on the stock unit side of the conveying unit,
wherein the conveying apparatus includes a holding unit that holds the target object and a pivotal shaft that rotates the holding unit in a horizontal plane, and the preparatory stage is arranged between the pivotal shaft and the stock unit,
and wherein an inside of the conveying unit and an inside of the stock unit communicate with each other through a communication opening, and the preparatory stage is arranged on a virtual line connecting between the pivotal shaft and a center of the stock unit, the preparatory stage being arranged between the pivotal shaft and the communication opening, and when the preliminary processing is performed, the target object arranged on the preparatory stage partially enters the communication opening.

2. The plasma processing method according to claim 1, wherein the preliminary processing is adjustment of a rotational angular position of the target object placed on the preparatory stage performed by rotating the preparatory stage about a rotary shaft extending in a vertical direction.

3. The plasma processing method according to claim 2, wherein the target object includes a notch at its outer circumference, and the preliminary processing is rotating the preparatory stage according to an output from a notch detecting sensor that optically detects the notch of the target object placed on the preparatory stage.

4. The plasma processing method according to claim 1, wherein the preliminary processing is an inspection as to whether or not the target object is in a state suitable for the plasma processing.

5. The plasma processing method according to claim 4, wherein the target object is a tray that can be conveyed and that accommodates a substrate, and the preliminary processing is a determination as to whether the substrate is present or absent based on an output from a substrate detecting sensor that optically detects presence and absence of the substrate in the tray placed on the preparatory stage.

6. The plasma processing method according to claim 4, wherein the target object is a tray that can be conveyed and that accommodates a substrate, and the preliminary processing is a determination as to whether or not the substrate is misaligned based on an output from a misalignment detecting sensor that optically detects misalignment of the substrate relative to the tray placed on the preparatory stage.

7. The plasma processing method according to claim 1, wherein the target object is transferred between the conveying apparatus and the preparatory stage by the preparatory stage rising and lowering.

* * * * *